United States Patent
Kato et al.

(10) Patent No.: US 6,488,419 B2
(45) Date of Patent: Dec. 3, 2002

(54) LIGHT EMITTING MODULE

(75) Inventors: Takashi Kato, Yokohama (JP);
Ken-ichi Kitayama, Yokohama (JP);
Akira Yamaguchi, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 21 days.

(21) Appl. No.: 09/812,883

(22) Filed: Mar. 21, 2001

(65) Prior Publication Data

US 2002/0018627 A1 Feb. 14, 2002

(30) Foreign Application Priority Data

Mar. 22, 2000 (JP) .................................. 2000-080694
Sep. 8, 2000 (JP) .................................. 2000-273514

(51) Int. Cl.[7] .............................................. G02B 6/36
(52) U.S. Cl. .............................. 385/93; 385/35; 385/89
(58) Field of Search .............................. 385/93, 89, 35

(56) References Cited

U.S. PATENT DOCUMENTS 5,764,826 A * 6/1998 Kuhara et al. ......... 250/227.11
5,787,215 A * 7/1998 Kuhara et al. .............. 359/115
5,812,715 A * 9/1998 Tiemeijer et al. ............. 385/73
5,825,792 A   10/1998 Villeneuve et al.

OTHER PUBLICATIONS

Tong, F. et al., "A Tunable Optical Filter for Wavelength Division Multiaccess Computer Network", Electro–Optic Computer Peripherals Technology (1992), vol. 1816, pp. 113–119.

* cited by examiner

Primary Examiner—Hung N. Ngo
(74) Attorney, Agent, or Firm—McDermott, Will & Emery

(57) ABSTRACT

Provided is a light emitting module that capable of adjusting the wavelength of light generated under operating conditions. The light emitting module is provided with a semiconductor light emitting device 16, first and second photodetectors 20, and an etalon 18. The semiconductor light emitting device 16 has a first end face 16b and a second end face 16a, and an active layer between the first end face 16b and the second end face 16a. Each of the photodetectors 20a, 20b is located so as to receive transmitted light from the first end face 16b of the semiconductor light emitting device. The etalon 18 has a portion of a first thickness d1 located between the first end face 16b and the photodetector 20a, and a portion of a second thickness d2 located between the first end face 16b and the photodetector 20b. The first thickness d1 of the etalon 18 is different from the second thickness d2.

20 Claims, 22 Drawing Sheets

WAVELENGTH (nm)

LIGHT EMITTING MODULE

BACKGROUND OF THE INVENTION

1. Field of the Invention

The present invention relates to a light emitting module.

2. Related Background Art

In 1.55 μm-band WDM systems, the wavelength spacing between adjacent channels is stipulated as 0.8 nm. This requires that the absolute accuracy of each channel wavelength should be controlled within the precision of ±0.1 nm or higher. DFB semiconductor lasers and DBR semiconductor lasers may be utilized for 1.55 μm-band WDM systems.

SUMMARY OF THE INVENTION

These semiconductor lasers provide a sharp oscillation spectrum, but their oscillation wavelength is determined by a diffraction grating fabricated in a laser chip at the manufacturing stage of semiconductor laser. It was not easy to yield a desired oscillation wavelength stably and accurately, because characteristics of the diffraction grating were affected by manufacturing process factors.

For implementation of it, there is the following attempt. A semiconductor laser chip is assembled to obtain a light emitting module. During operation of the module, output light from the light module is branched and this branch light is monitored by a large-scale apparatus like an optical spectrum analyzer. According to the monitor information, temperature or injection current of the semiconductor laser chip is adjusted.

However, in the wavelength division multiplexing (WDM) systems, it is not easy to realize a light emitting module applicable to the WDM systems because a plurality of wavelengths are used to transmit data in 16 channels or 32 channels.

It is, therefore, an object of the present invention to provide a light emitting module that permits easy adjustment of the wavelength of light generated in the light emitting module, without using any large-scale system like the optical spectrum analyzer.

In order to realize the light emitting module capable of attaining this object, the inventors conducted a variety of studies, e.g., on the light emitting modules incorporating the semiconductor laser. In order to adjust the oscillation wavelength of the light emitting module while operating the light emitting module, it is necessary to monitor the wavelength. For extracting oscillating light, an optical branching device, such as an optical coupler, needs to be coupled to output of the light emitting module. However, if the device having this function is used, the scale of the WDM systems will be large.

According to these studies, it became apparent that there were technical problems as follows. (1) There is a need for use of optical coupling means for obtaining monitor light to monitor light from the semiconductor light emitting element such as the semiconductor laser. (2) There is a need for use of separating means for separating the light from the coupling means into wavelength components. (3) There is a need for use of converting means for converting the light components from the separating means into electric signals.

In view of these problems, the inventors accomplished the present invention in structure as follows.

A light emitting module of the present invention comprises a semiconductor light emitting device, a photodetection device, an etalon device, and collimating means. The semiconductor light emitting device has first and second end faces. The photodetection device has first and second photodetectors optically coupled to the first end face of the semiconductor light emitting device. The etalon device has a first portion having a first thickness and a second portion having a second thickness. The first portion of the first thickness is provided so as to be located between the first end face of the semiconductor light emitting device and the first photodetector. The second portion of the second thickness is provided so as to be located between the first end face of the semiconductor light emitting device and the second photodetector. The first thickness of the etalon device is different from the second thickness of the etalon device. The collimating means functions to provide substantially collimated light for the etalon device that receives the light from the semiconductor light emitting device.

In the etalon device, the thickness of the portion located between the first end face of the semiconductor light emitting device and the first photodetector is different from that of the portion located between the first end face of the semiconductor light emitting device and the second photodetector. Light of different wavelength components passes through portions of the different thicknesses corresponding to the wavelength components in the etalon device. Therefore, if the wavelength components of light from the semiconductor light emitting device is changed, intensities of light passing through the particular portions of the etalon device varies in response to the change. This variation is converted into electric signals by the first photodetector and the second photodetector. Changes of these electric signals indicate the change of wavelengths in the light generated in the semiconductor light emitting device.

A difference signal between these electric signals represents a direction of the change of wavelengths in the light. By controlling the semiconductor light emitting device portion so as to keep this difference signal constant, it becomes feasible to keep the wavelength constant in the light generated in the semiconductor light emitting device.

The features according to the present invention as described below can be combined with the above-stated invention. The features according to the present invention as described below can be also combined with each other to enables the module to obtain actions and effects of the respective features and also obtain actions and effects achieved by the combination.

In the light emitting module, the etalon device has first and second surfaces. The first surface is arranged so as to be opposed to the second surface. The first and second surfaces are positioned so that an interval between them in the first portion is the first thickness. The etalon device has third and fourth surfaces. The third surface is provided so as to be opposed to the fourth surface. The third and fourth surfaces are located so that an interval between them in the second portion is the aforementioned second thickness. This configuration can provided the etalon device having the first and second thicknesses.

In the light emitting module of the present invention, the etalon device has a light receiving surface and a light outgoing surface. The light receiving surface is arranged so as to receive the light from the first end face of the semiconductor light emitting device, and the light outgoing surface is arranged so as to face the light receiving surface. The light receiving surface includes first and third faces. The light outgoing surface includes second and fourth faces. In the light emitting module of the present invention, the light receiving surface is inclined to the light outgoing surface.

Because of this inclination, the distance between the light receiving surface and the light outgoing surface increases in a direction directed from the first portion to the second portion of the etalon device.

The etalon device has the light receiving surface and the light outgoing surface, the distance of which is changed in the first direction. When the etalon device is moved relative to the first and second photodetectors in the first direction, the transmission spectra achieved by the first and second portions of the etalon device is changed. This change results in changing the wavelength components of light received through the etalon device by the first and second photodetectors. The center wavelength of light generated in the semiconductor light emitting device can be adjusted by making use of this change. The transmitting peak wavelengths of the etalon device, which is utilized for adjusting the center wavelength of the light generated by the semiconductor light emitting device, can also be adjusted by rotating the etalon device. In the light emitting module, the etalon device is arranged as inclined relative to the semiconductor light emitting device in a direction perpendicular to a second direction, which is defined as a direction directed from the first portion to the second portion of the etalon device. This can reduce the amount of light reflected by the etalon device back to the semiconductor light emitting device.

In the light emitting module, each of the first and second photodetectors can be a photodiode element. In the light emitting module of the present invention, the first and second photodetectors can be attached to the etalon device. The light-emitting module of the present invention can further comprise an aperture device. The aperture device has one or more apertures located between each of the first and second photodetectors and the semiconductor light emitting device. The aperture device defines a position(s) on the etalon device at which the light should be transmitted. This determines wavelength regions of light received by the first and second photodetectors. The aperture device can reduce optical reflection from the first and second photodetectors to the semiconductor light emitting device.

In the light emitting module, the collimating means includes an optical lens. The collimating means can include an optical lens, such as convex lenses or concave lenses, but it is not limited to these examples. The collimating means includes an optical circuit. The optical circuit has an optical branching waveguide and an optical waveguide for guiding the light from the semiconductor light emitting device to predetermined positions on the etalon device.

The light emitting module further comprises means for reducing optical returning from at least either one of the first and second photodetectors and the etalon device through the optical lens to the semiconductor light emitting device. In the light emitting module of the present invention, the lens has a size determined so as to reduce the optical returning from at least either one of the first and second photodetectors and the etalon device to the semiconductor light emitting device. The size means at least either one of a height and a width of the lens. The lens has a cut face extending in a direction of the optical axis of the lens. When the optical lens has the cut surface, the height of this optical lens can be set low. In the light emitting module of the present invention, the lens has a shielding portion provided so as to reduce the optical returning from at least either one of the first and second photodetectors and the etalon device to the semiconductor light emitting device. This can decrease the amount of light which is incident on the semiconductor light emitting device through the optical lens and is reflected by the etalon device and the first and second photodetectors.

In the light emitting module, the etalon device preferably receives incident light in a range of an angle not more than 85° and/or in a range of an angle not less than 95° where the angle is formed with respect to an axis extending perpendicularly to a direction in which the first and second photodetectors is arrayed.

The light emitting module further comprises wavelength adjusting means for changing a wavelength of light generated by the semiconductor light emitting device in response to signals from the first and second photodetectors. This wavelength adjusting means can adjust the temperature of the semiconductor light emitting device according to the electric signals from the first and second photodetectors, and thereby change the wavelength of light generated by the semiconductor light emitting device. For examples, the wavelength adjusting means includes a thermoelectric cooler capable of adjusting the temperature of the semiconductor light emitting device and an optical waveguide having electrodes capable of changing the refractive index of a wave guide by an applied electric field.

In the light emitting module, the wavelength adjusting means can comprise a control circuit and temperature changing means. The control circuit can generate a control signal for adjusting, in response to the electric signals from the first and second photodetectors, the wavelength of light generated in the semiconductor light emitting device. The temperature changing means can adjust the temperature of the semiconductor light emitting device according to the control signal. The control circuit can be arranged inside or outside the light emitting module as required.

The following configuration can be applied to the light emitting module. The etalon device can provide light including a first wavelength component in a predetermined oscillation spectrum of light received from the semiconductor light emitting device, and provide light including a second wavelength component different from the first wavelength. The first and second photodetectors can provide first and second electric signals corresponding to the light of the first and second wavelengths, respectively. The temperature changing means can adjust the temperature of the semiconductor light emitting device in response to a difference signal generated from the first electric signal and the second electric signal. A driving circuit can adjust a driving current for controlling the optical output of the semiconductor light emitting device, in response to a sum signal generated from the first electric signal and the second electric signal. The center wavelength of light generated in the light emitting device is preferably located between the first wavelength and the second wavelength.

The light emitting module comprises the semiconductor light emitting device, the etalon device, and the first and second photodetectors and may further comprise a control circuit and a temperature controller. The etalon device acts as a wavelength filter whose transmission spectral characteristics differ according to transmission positions thereof. Accordingly, the intensities of light transmitted according to the transmission spectra at the respective transmitting received by the etalon, from the semiconductor light emitting device. The control circuit can generate a difference signal between electric signals from the first and second photodetectors and can also generate a sum signal thereof. The temperature controller changes the temperature of the semiconductor light emitting device, in response to the difference signal from the control circuit.

In the light emitting module, the predetermined thickness d of the etalon device should be determined as follows:

$$d = c/(2 \cdot n \cdot k \cdot \delta v_{WDM}),$$

where $$k = 1 - (dv/dT)_{etalon}/(dv/dT)_{LD},$$

$(dv/dT)_{etalon}$: change rate of light frequency against temperature, wherein the light interferes at the position of the thickness d of the etalon device, $(dv/dT)_{LD}$: change rate of light frequency against temperature, wherein the light is generated in the semiconductor light emitting device, $\delta v_{WDM}$: wavelength division multiplexing (WDM) frequency spacing.

When the oscillation wavelength of the semiconductor light emitting device is changed by changing the temperature of the semiconductor light emitting device, this etalon device allows the oscillation wavelength of the semiconductor light emitting device to change by the spacing between oscillation wavelengths of light which the semiconductor light emitting device is capable of generate.

The features according to the present invention as described below are applied to the etalon device in which the light receiving surface is inclined relative to the light outgoing surface so that the interval between the light receiving surface and the light outgoing surface increases in the direction from the first portion to the second portion of the etalon device.

In the light emitting module, the interval between the first photodetector and the second photodetector is determined as follows: an absolute value of a slope at a zero point of a difference spectrum is not less than 200 (%/nm). The difference spectrum is defined by a difference between a first transmission spectrum in the first portion of the etalon device and a second transmission spectrum in the second portion thereof.

In the light emitting module, the reflectivity of each of the light receiving surface and the light outgoing surface is in a range of not less than 30% nor more than 60%. The distance L (mm) between the first photodetector and the second photodetector satisfies the following relations where the reflectivity of the etalon device is R(%):

$$-0.01 \times R + 0.6 \leq L \leq -0.01 \times R + 0.8, \text{ and } 0.2 \leq L.$$

In the region specified by these relations, the difference spectrum characteristics demonstrate excellent linearity. The wavelengths of the light transmitted by the etalon device are selected by changing the spacing between the photodetectors. This selection permits change in the profile of the difference spectrum. This change optically enhances detection sensitivity of wavelength shift in the semiconductor light emitting device.

In the light emitting module, each of the first photodetector and the second photodetector has a first width and a second width and is formed so that the first width is smaller than the second width. The first width is defined as a length in a direction in which the light receiving surface of the etalon device is inclined relative to the light outgoing surface thereof. The second width is defined as a length in a direction perpendicular to the foregoing direction, and. This configuration improves monochromaticity of received light.

In the light emitting module, the semiconductor light emitting device includes a semiconductor laser device having first and second end faces. This configuration provides a semiconductor laser module.

BRIEF DESCRIPTION OF THE DRAWINGS

The above objects and other objects, features, and advantages of the present invention will become more readily apparent from the following detailed description of preferred embodiments of the present invention with reference to the accompanying drawings, in which.

DESCRIPTION OF THE PREFERRED EMBODIMENTS

The embodiments of the present invention will be described below with reference to the accompanying drawings. The same portions will be denoted by the same reference symbols, if possible.

Figure 1:
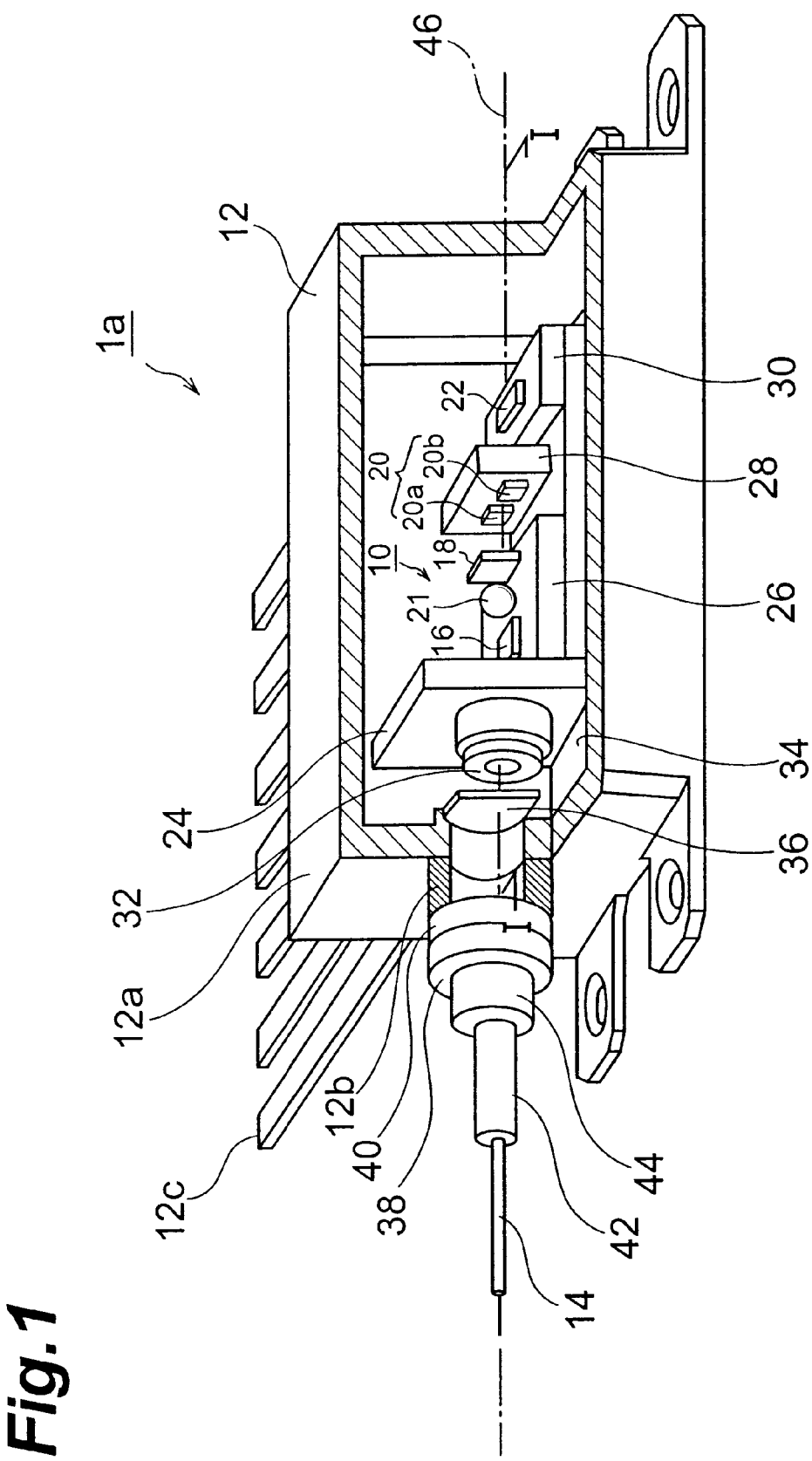
FIG. 1 is a perspective view of a semiconductor laser module, part of which is presented as a broken view in order to clarify the interior thereof.
Figure 2:
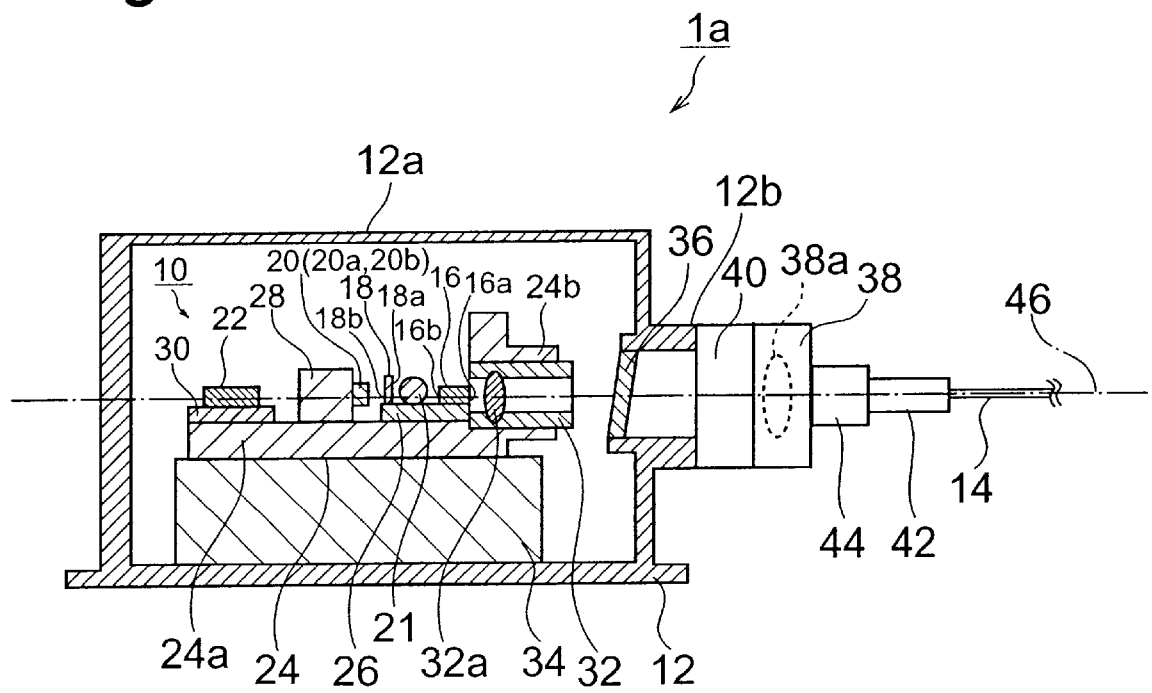
FIG. 2 is a cross-sectional view taken along a line I—I of FIG. 1 to show the principal part of the semiconductor laser module.

In the embodiments, the light emitting modules of the present invention are applied to semiconductor laser modules, but the present invention is by no means intended to be limited to such embodiments. FIG. 1 is a perspective view of a semiconductor laser module. FIG. 2 is a cross-sectional view showing the principal part of the semiconductor laser module. Referring to FIG. 1 and FIG. 2, the semiconductor laser module 1 comprises a semiconductor-laser-module principal portion 10 and a housing 12.

In the embodiment shown in FIG. 1, the housing 12 is a container such as a butterfly package. The principal portion 10 is placed on the bottom surface in the package 12. The principal portion 10 is sealed in the package 12 while being filled with inert gas, e.g., nitrogen gas. The housing 12 has a main portion 12a accommodating the principal portion 10, a cylindrical portion 12b for guiding an optical fiber 14 to the principal portion 10, and a plurality of lead pins 12c.

The principal portion 10 has mount members 24, 26, 28, 30 and a lens holding member 32 for holding a lens (32a in FIG. 2). On the mount members 24, 26, 28, 30 are members, the semiconductor optical devices 16, 20a, 20b, an etalon 18, collimating means 21 like a lens, and a signal processor portion 22 are mounted. In the principal portion 10, the mount member 24 is placed on a thermoelectric cooler 34, e.g., a Peltier element. The thermoelectric cooler 34 can absorb or emit thermal energy according to a received current, thereby controlling temperature. Since the semiconductor laser 16 is placed on the mount member 24, the thermoelectric cooler 34 works as temperature changing means for controlling the temperature of the semiconductor laser. Materials suitable for the mount member 24 are excellent thermal conductive materials, e.g., aluminum nitride (AlN) utilized for the chip carrier.

A wall surface of the package main body 12a has an optical window sealed by hermetic glass 36, in its portion communicating with the cylindrical portion 12b. The cylindrical portion 12b of the package 12 has a through hole communicating with the main body 12a. Light propagates through the through hole from the semiconductor laser 16 toward an end (not shown) of the optical fiber 14. A lens holding member 38 for holding a lens (38a in FIG. 2) is provided at the distal end of the cylindrical portion 12b. An optical isolator 40 can be provided between the lens holding member 38 and the cylindrical portion 12b. The optical isolator 40 intercepts backward light from the optical fiber 14.

The optical fiber 14 is introduced through the distal end of the cylindrical portion 12b. The optical fiber 14 is covered and protected at its distal end by a ferrule 42. The lens holding portion 38 holds a sleeve 44. When the ferrule 42 is inserted in the sleeve 44, it is positioned relative to the package 12. Thereafter, the optical fiber 14, the lens of the lens holding member 40, and the principal portion 10 have been positioned.

Referring to FIG. 2, in the principal portion 10, the mount member 24 includes a device mount portion 24a and a lens support 24b. The lens support portion 24b is provided on one principal surface of the device mount portion 24a. The lens support portion 24b has a guide hole for receiving the lens holding member 32. The lens holding member 32 is inserted in the guide hole, and the lens holding member 32 holds a lens 32a for condensing light from the semiconductor laser 16 mounted on the device mount portion 24a. The distance between the semiconductor laser 16 and the lens 32a can be adjusted by moving the position of the lens holding member 32 in the guide hole.

The semiconductor light emitting device includes a semiconductor light emitting device, e.g., a semiconductor laser 16. The semiconductor laser 16 has a first light reflecting surface 16b and a second light reflecting surface 16a, and an active layer. The active layer is arranged between the first light reflecting surface 16b and the second light reflecting surface 16a, and generates light in injecting carriers thereinto. The light emitting surface 16a and light reflecting surface 16b compose an optical cavity. The light emitting surface 16a is optically coupled through the lenses 32a and 38a to the optical fiber 14.

Figure 3:
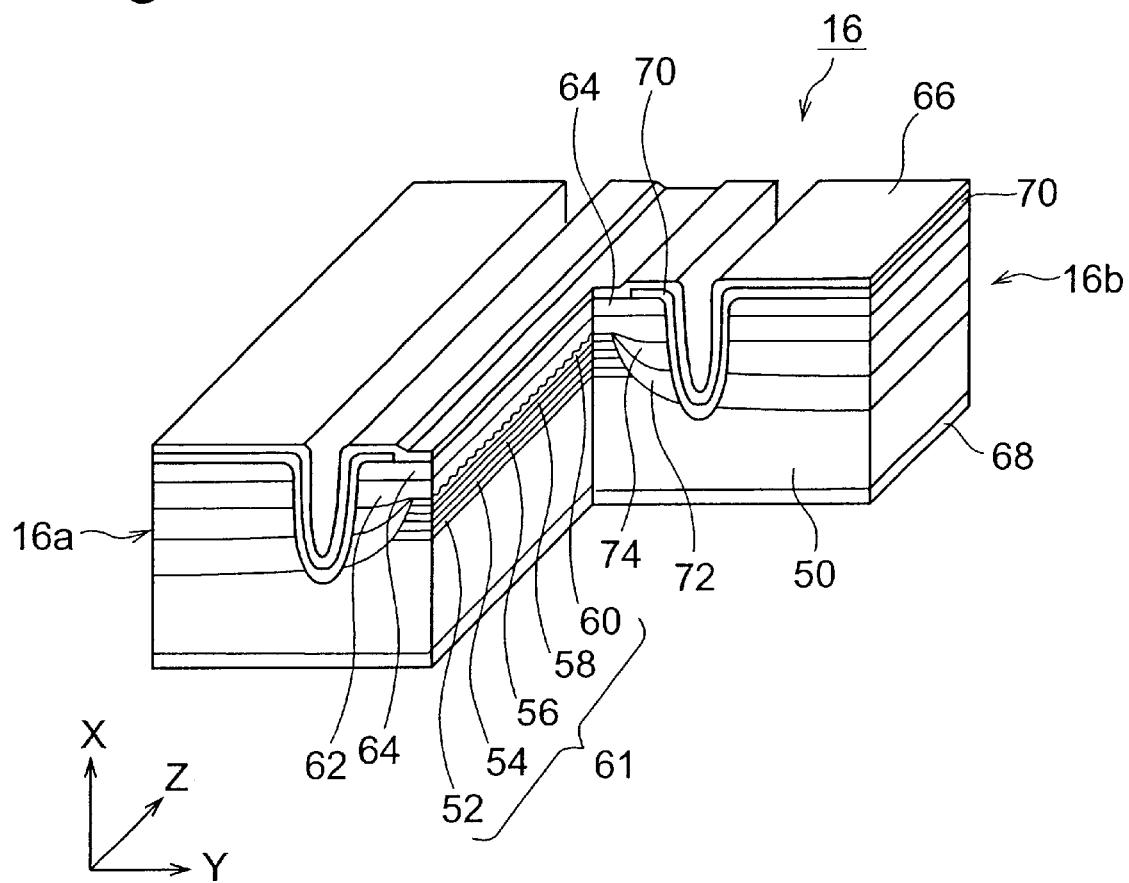
FIG. 3 is a schematic view of a distributed feedback (DFB) semiconductor laser, part of which is presented as a broken view in the direction of the optical axis of laser light emitted.

The semiconductor laser 16 can be, for example, a Fabry-Perot laser, but it should not be limited to the Fabry-Perot semiconductor lasers, and distributed feedback (DFB) semiconductor lasers can be also used in a similar way. FIG. 3 is a schematic view of a DFB semiconductor laser 16.

Referring to FIG. 3, the DFB semiconductor laser has a buried portion 61, a second cladding layer 62, a contact layer 64, and a striped electrode 66 for the first conduction part in turn on one principal surface of semiconductor substrate 50, and also has an electrode 68 for the second conduction part on the back surface of the semiconductor substrate 50. The buried portion 61 comprises a buffer layer 52, a first cladding layer 54, a first guide layer 56, an active layer 58, and a second guide layer 60 in turn on the substrate 50, and these are formed in a rectangular region ranging from one end face 16a of the semiconductor laser 16 to the other end face 16b opposed to the end face 16a.

The active layer 58 contains InGaAsP semiconductors. For example, the active layer 58 can be constructed by employing the MQW structure in which InGaAsP semiconductor layers of different compositions are multilayered. Preferably, the cladding layer can be constructed by employing an InP semiconductor of an appropriate conduction type. The contact layer can be constructed by employing an InGaAs semiconductor.

The buried portion 61 has a mesa region extending in an optical-axial direction (z-axis) in which the laser light is emitted. The buried portion 61 is located between first block layer 72 and second block layer 74, which are formed on the substrate 50. When an n-InP substrate is employed, the first block layer 72 are made of a p-InP semiconductor layer, and the second block layer 74 of an n-InP semiconductor layer. The substrate 50 and the second cladding layer 62 are electrically isolated from each other through a pn junction.

In the preset embodiment a diffraction grating is formed at one interface between the cladding layer 54 and the guide layer 56, but it may be formed at another interface between the cladding layer 62 and the guide layer 60. The grating is formed in the direction of the optical axis of the laser light. Light generated in the active layer 58 is optically coupled with the grating to select a predetermined wavelength.

The stripe electrode 66 is electrically connected to the contact layer 64 in an opening portion provided in an insulating film 70. Since this opening portion is provided along the buried portion 61, carriers can be efficiently supplied to the buried portion 61. As a result, carrier narrowing and optical confinement is implemented efficiently.

The light emitting surface 16a of the semiconductor laser chip can be coated with a low-reflection coating film for decreasing the reflectivity and the light reflecting surface 16b can be coated with a light-reflecting coating layer for increasing the optical reflectivity. The low-reflection coating film and light-reflecting coating film can be obtained by adjusting film thicknesses of multilayer films of SiN, a-Si, and so on.

Referring again to FIG. 2, the etalon device, such as the etalon 18, is mounted on the mount member 26. An entrance surface 18a of the etalon 18 is optically coupled to the light reflecting surface 16b of the semiconductor laser 16. This optical coupling is implemented by an arrangement in which the entrance surface 18a of the etalon 18 faces the light reflecting surface 16b of the semiconductor laser 16. An emitting surface 18b of the etalon 18 is optically coupled to photoelectric conversion means, such as the photodetecting device 20 including first and second detectors 20a, 20b. This optical coupling is implemented by an arrangement in which the emitting surface 18b faces the first and second detectors 20a and 20b.

Figure 4A:
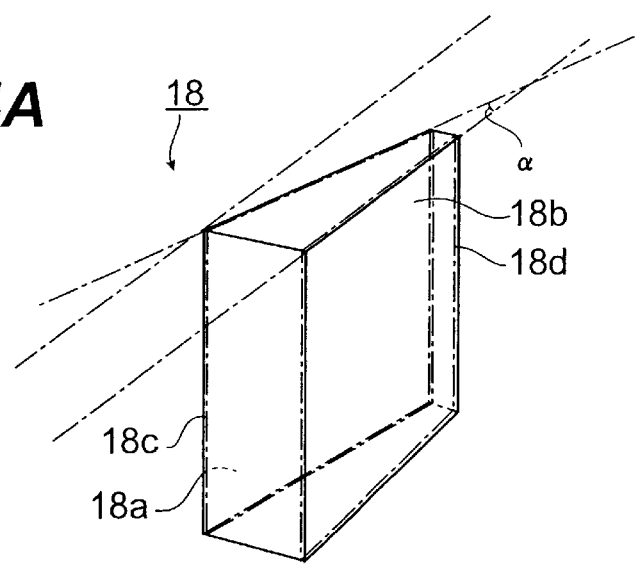
FIG. 4A is a perspective view showing an example of the etalon.
Figure 4B:
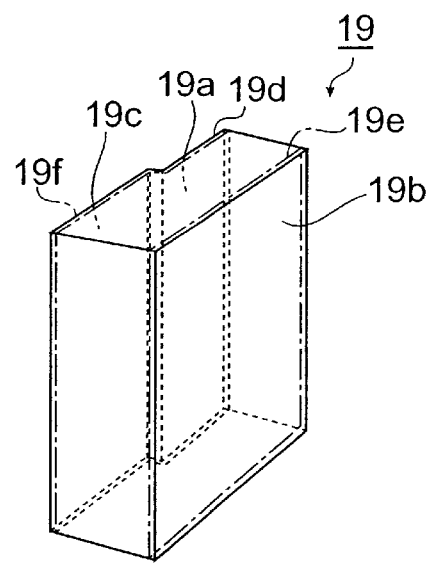
FIG. 4B is a perspective view showing another example of the etalon.

FIG. 4A shows an etalon 18 as an embodiment and FIG. 4B shows another etalon as an embodiment. Referring to FIG. 4A, each of light receiving surface 18a and light outgoing surface 18b of etalon 18 is provided so as to constitute an optical plane. The light receiving surface 18a and light outgoing surface 18b are inclined at a small angle α relative to each other. The angle α is set in a range which light incident to the etalon 18 allows the multiple interference between the light receiving surface 18a and the light outgoing surface 18b. Specifically, the angle α is preferably not less than 0.01 degrees nor more than 0.1 degrees.

The etalon 18 has a multilayer reflecting film 18c provided so as to make the light receiving surface 18a, and a multilayer reflecting film 18d provided so as to make the light outgoing surface 18b. The reflectivity of the light receiving surface 18a and the light outgoing surface 18b can be adjusted by the multilayer reflecting films 18c, 18d, respectively. In the description below, this etalon 18 will be also called a wedge etalon.

As shown in FIG. 4B, the etalon device, such as an etalon 19, has a light receiving surface 19a, a light receiving surface 19c, and a light outgoing surface 19b, each of which is an optical plane. The light receiving surface 19a is approximately parallel to the light outgoing surface 19b and the interval between these surfaces is d1. The light receiving surface 19c is also approximately parallel to the light outgoing surface 19b and the interval between these surfaces is d2. The distance d2 is greater than that of d1. Further, the etalon 19 has multilayer reflecting films 19d, 19e, 19f thereon, as in the etalon 18, to form desired values of reflectivity thereby on the respective surfaces.

Figure 4C:
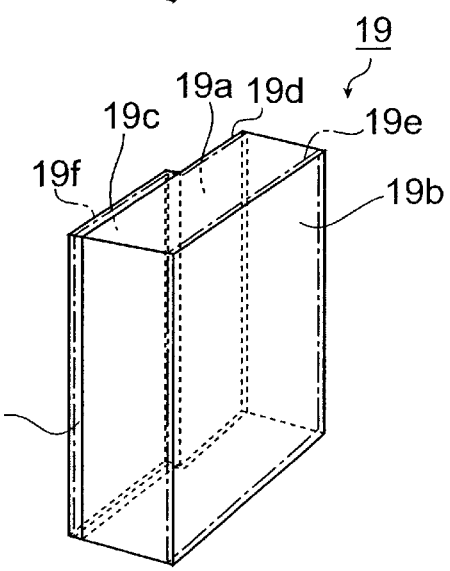
FIG. 4C is a drawing showing a specific example of the etalon shown in FIG. 4B.

In FIG. 4C, in order to provide the difference between the spacing d2 and the spacing d1 in the etalon 19, a film 19g is deposited on the etalon 19 to obtain the thickness equivalent to the difference. The film 19g is made of material that can transmit the light from the semiconductor light emitting device, and preferably this material can be $SiO_2$, for example. Preferably, the deposited film is made of material having the refractive index substantially equal to that of the etalon 19. The term "substantially equal" means that the refractive index is within the range of ±0.5% corresponding to film forming variation from a manufacturing point of view.

Figure 5A:
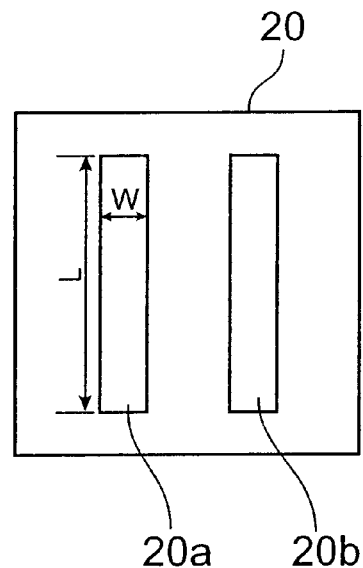
FIG. 5A is a front view of photoelectric conversion means, FIG. 5B a schematic plan view showing an example of use of the photoelectric conversion element of FIG. 5A with the etalon of FIG. 4A, and FIG. 5C a schematic view showing an example of use of the photodetection device of FIG. 5A with the etalon of FIG. 4A.

FIG. 5A is a drawing showing the photoelectric conversion means as represented by photodetectors 20a, 20b. Referring to FIG. 5A, the photodetectors 20a, 20b are arrayed in a first direction on a photodiode chip 20. The photodetectors 20a, 20b can be photodiodes having respective photoreception sensitivity to a wavelength region including the wavelengths of the laser light emitted from the semiconductor laser 16. The photodetectors 20a, 20b are arrayed in the first direction. Each of the photodetectors 20a, 20b has a maximum width W of a photodetection area with respect to the first direction and a maximum length L of the photodetection area with respect to a second direction perpendicular to the foregoing first direction.

Preferably, the maximum width W is shorter than the maximum length L. This configuration is preferable, particularly, in use with the wedge etalon 18. Since the light receiving surface 18a of the wedge etalon 18 is inclined relative to the light outgoing surface 18b, wavelengths of transmitted light also vary in the direction of the inclination. In this configuration, the smaller the width (the maximum width in one direction described above) of the photodetection areas of the photodetectors 20a, 20b, the more the monochromaticity of light converted into electric signals is improved. This improvement in monochromaticity allows the output signal from each photodetectors to steeply change against change of wavelengths. However, if the width of the photodetection areas is merely decreased, the intensity of the total received power will become lowered. In order to compensate for the decrease in quantity of light, it should be noted that there is no change in the wavelength of light from the etalon, i.e., no chromatic dispersion in the second direction perpendicular to the aforementioned first direction. The sizes of the photodetectors 20a, 20b are long in the perpendicular second direction, and are short in the first direction in which chromatic dispersion occurs.

Figure 5B:
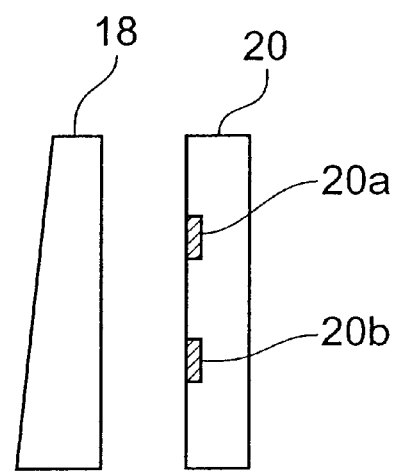
Figure 5C:
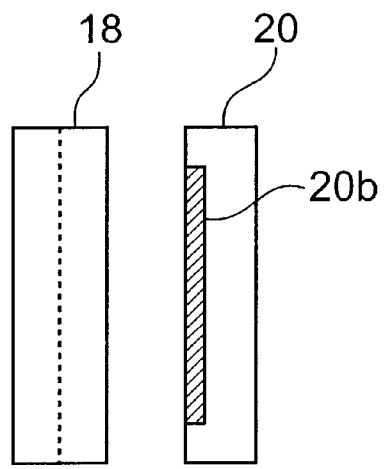

The photodetectors 20a, 20b are positioned relative to the wedge etalon 18 as shown in FIGS. 5A to 5C. In FIGS. 5A to 5C, the photodetection areas of the photodetectors 20a, 20b are rectangular, and, for example, the photodetection areas may be short in the array direction and long in the direction perpendicular to the array direction. Although the etalon 19 demonstrates no chromatic dispersion, the photodetectors 20a, 20b as shown in FIG. 5A may be combined with the etalon 19.

Figure 6A:
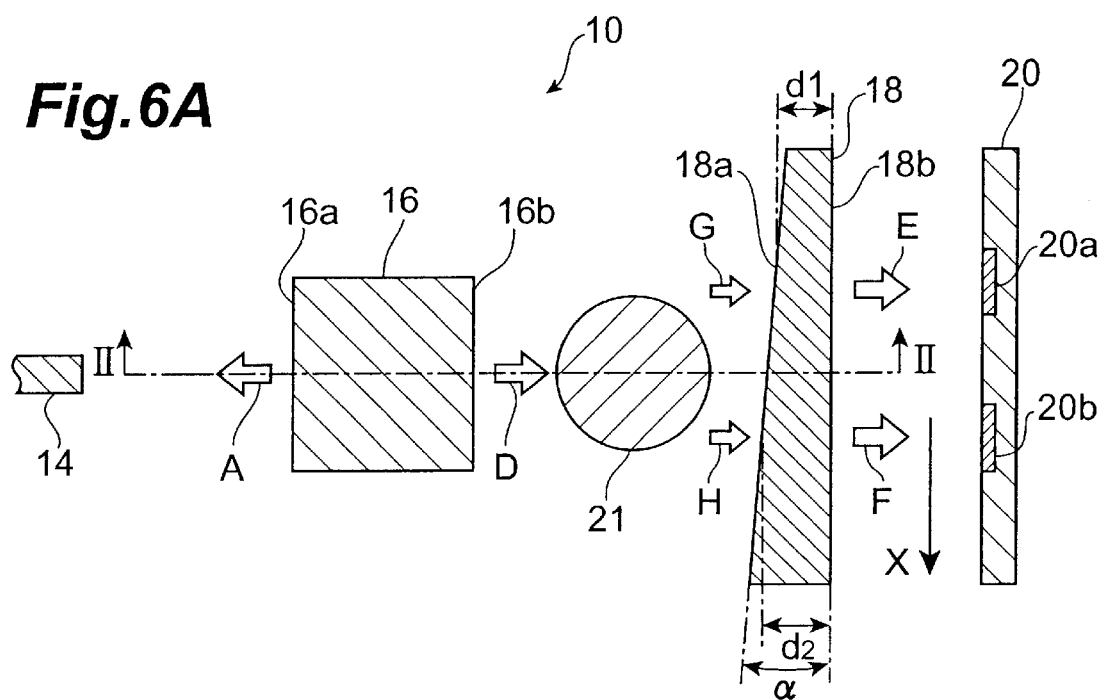
FIG. 6A is a plan view showing a configuration of the etalon as an example, FIG. 6B a plan view showing another configuration of the etalon as an example, and FIG. 6C a drawing showing a side view of the configuration of the etalon as an example.
Figure 6B:
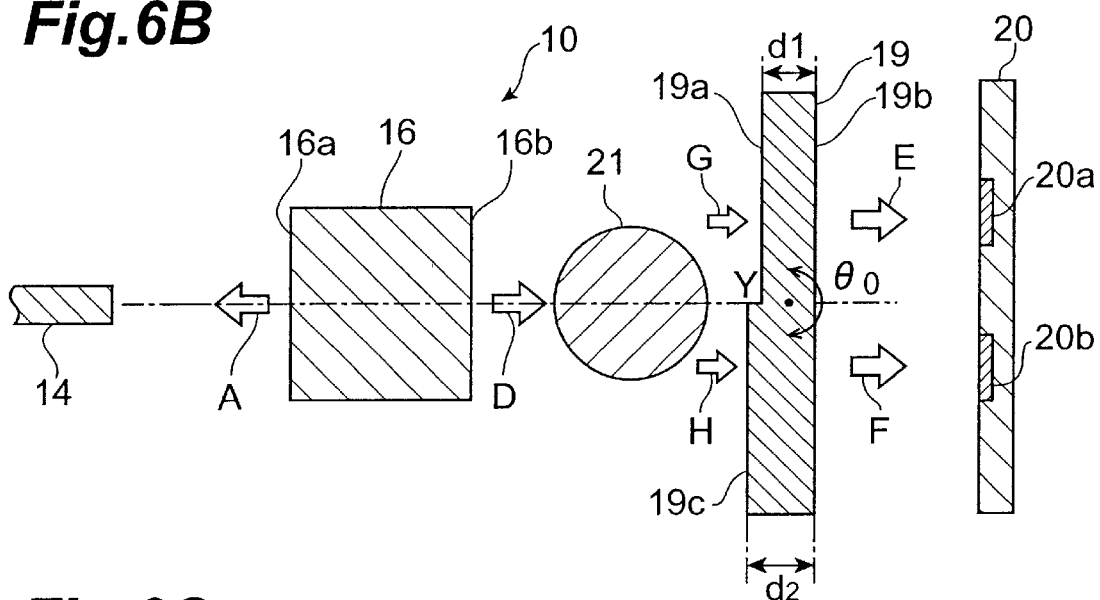
Figure 6C:
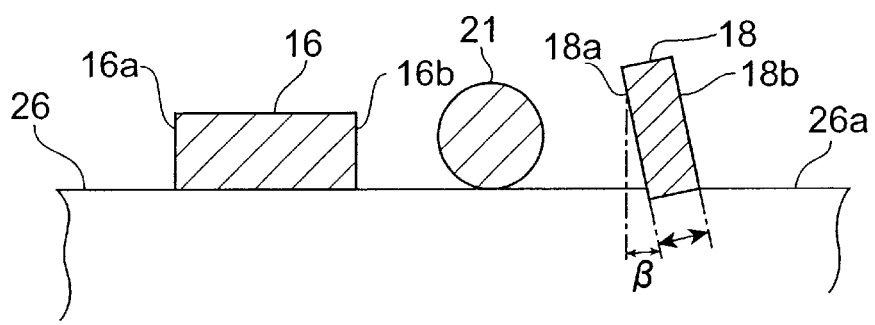

FIGS. 6A to 6C schematically show the arrangement of the semiconductor laser 16, etalon, and collimating means 21. The etalon 18 shown in FIG. 4A or the etalon 19 shown in FIGS. 4B and 4C is applicable to an etalon herein. The light emitting module 1a can include the collimating means 21 when required, so as to be able to provide the etalon 18 with substantially collimated light. The collimating means is arranged between the etalon device and the semiconductor light emitting device and works to receive the light from the first end face of the semiconductor light emitting device and provide the substantially collimated light.

Figure 8A:
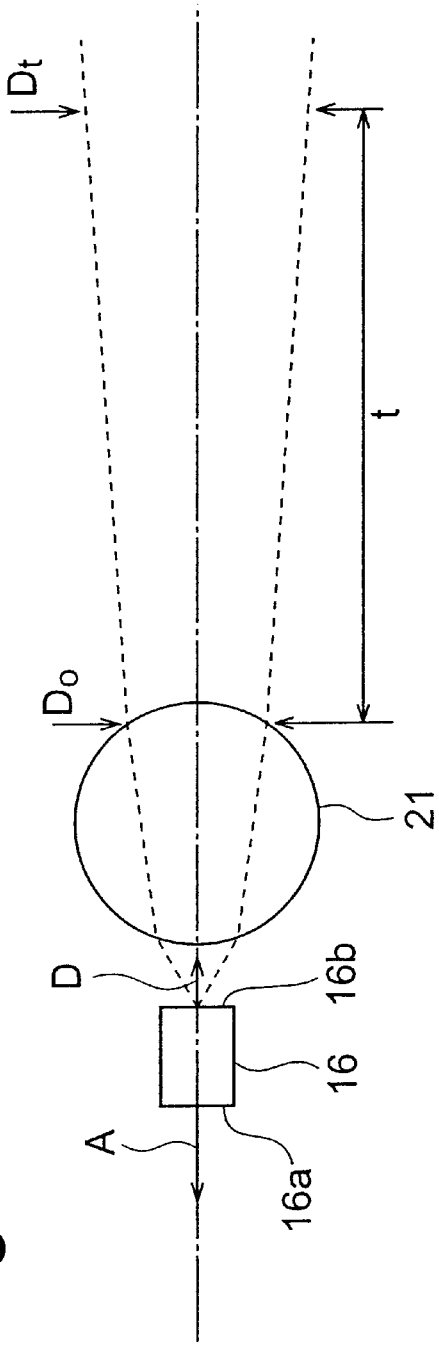
FIG. 8A and FIG. 8B are schematic views concerning collimation light.

As shown in FIG. 8A, the definition of the substantially collimated light is associated with a beam width change, specified by the following equation, between a beam width $D_0$ at a certain position and a beam width $D_1$ at another position apart from the position by a distance t:

$$\delta D = (D_1 - D_0)/D_0.$$

Figure 8B:
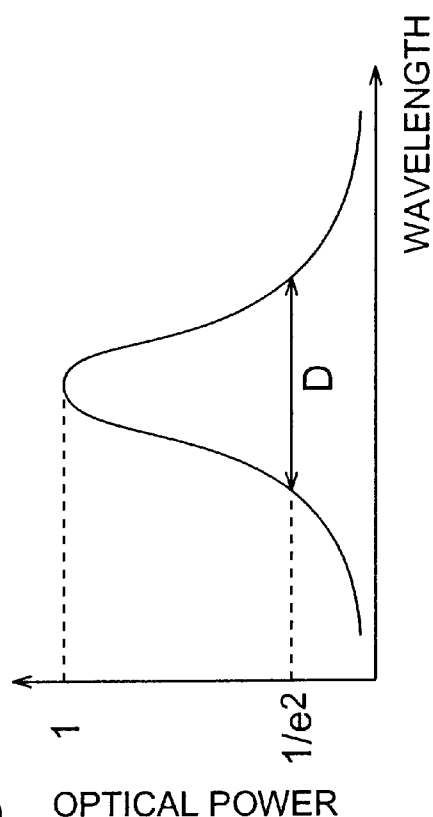

The "substantially collimated light" means the range of $|\delta D| \leq 0.5$. As shown in FIG. 8A, reference symbol $D_0$ designates a beam width at an exit position of the collimating means 21 such as a lens, and reference symbol $D_1$ designates a beam width at a position 20 cm apart therefrom. As shown in FIG. 8B, the beam width D is defined as a interval between two points on the wavelength axis where the optical power is $1/e^2$ times the intensity at the peak of the spectrum of the light from the semiconductor laser 16. The inventors think that values of typical $D_0$ in the semiconductor laser modules are within the range of not less than 0.3 mm nor more than 5 mm.

In FIGS. 6A and 6B, the light reflecting surface 16b of the semiconductor laser 16 emits divergent light D. The light collimating means 21, such as a spherical lens, converts the light D into substantially collimated light G and H. After that, the light G and H is incident to the single etalon 18. The light G and H mainly is incident on a first position at which the etalon 18 has the thickness d1 and on a second position at which the etalon 18 has the thickness d2 (=d1+δ). Among these light G and H, the etalon transmits wavelength components corresponding to the thicknesses of the etalon at the incident positions.

The etalon 18 is the wedge etalon making the angle α between the light receiving surface 18a and the light outgoing surface 18b, as shown in FIG. 6A. This inclination realizes the thickness d1 at the first position of the etalon 18 and the thickness d2 at the second position. The thicknesses of the etalon 18 at the first and second positions vary with movement of the etalon 18 in the direction indicated by Arrow X. This results in change of transmission spectra. This can change a wavelength at an intersection between a pair of spectra specified by the first and second positions.

In the etalon 19, as shown in FIG. 6B, the light receiving surface 19a and the light outgoing surface 19b near the first position realize the thickness d1, and the light receiving surface 19c and the light outgoing surface 19b near the second position the thickness d2. These surfaces 19a, 19b, 19c are provided substantially in parallel to each other. In this etalon, the transmission spectra are not changed by a small variation in the positioning of the etalon 19 in a direction indicated by Arrow X. This shows that there is a little variation in a wavelength at the intersection between the pair of spectra specified by the first and second positions at which the light G and H passes, even when some placement error occurs in the assembly. When the etalon 19 is rotated in an angular direction $\theta_0$ about an axis Y, the values of effective thickness at the first and second positions, i.e., the values of optical thickness in the etalon 19, vary so as to change the transmission spectra, i.e., wavelengths of transmitted light. The axis Y (the direction normal to the surface of the drawing) is perpendicular to the direction X and to the direction of the optical axis of the lens 21.

FIG. 6C is a cross-sectional view taken in a line II—II of FIG. 6A. The etalon 18 is located on the mount surface 26a of the mount member 26 so that the light receiving surface 18a of the etalon 18 is inclined relative to the mount surface 26a. This inclination permits the etalon 18 to demonstrate the constant free spectral range (FSR) even if the etalon 18 is moved in the direction indicated by Arrow X. In this case, the light receiving surface 18a of the etalon 18 is inclined at an angle β relative to the reflecting end face 16b of the semiconductor light emitting device 16. This inclination is realized by rotating the etalon about a rotation axis (perpendicular to the surface of the drawing) in the X-axis shown in FIG. 6A.

Figure 7A:
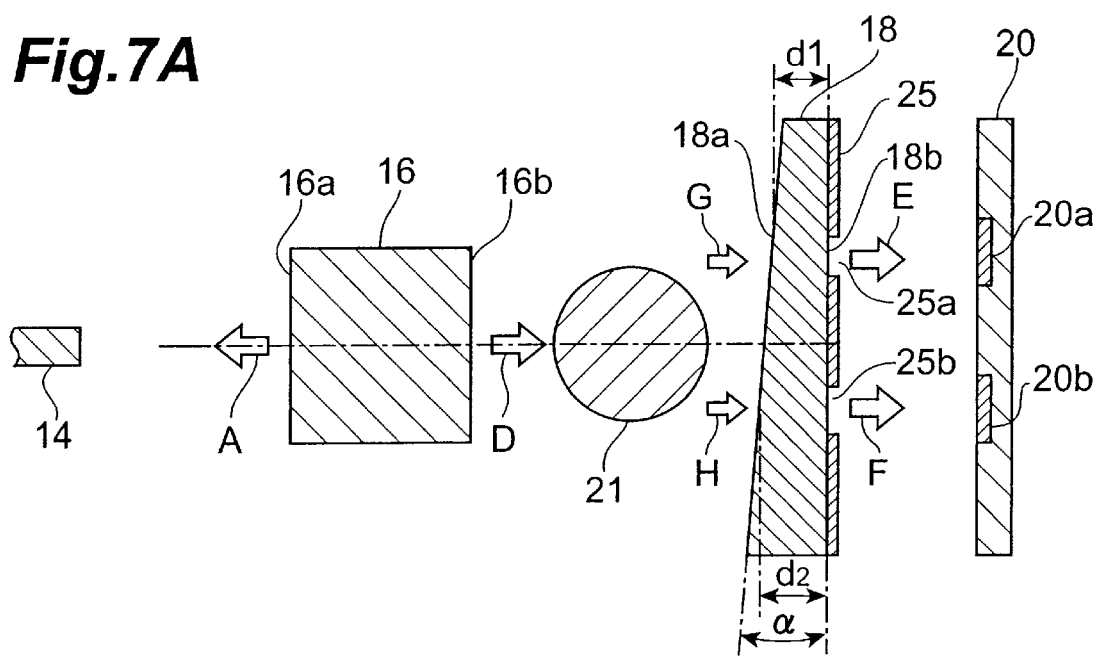
FIG. 7A and FIG. 7B are schematic views showing configurations of the etalon as examples.

FIG. 7A shows a configuration in which an aperture device 25 is added to that shown in FIG. 6A. The aperture device 25 has a plurality of apertures 25a, 25b. The positions of the apertures 25a, 25b are determined so as to correspond to the first and second photodetectors 20a, 20b. The aperture device 25 is located so as to face either of the light receiving surface 18a and the light outgoing surface 18b of the etalon 18. In FIG. 7A, for example, the aperture device 25 is arranged on the light outgoing surface 18b. In this configuration, the photodetectors 20a, 20b can receive the only light that transmits through the etalon 18 and can pass through the apertures of the aperture device 25. Therefore, the positions 25a, 25b of the apertures in the aperture device 25 define the wavelengths of light reaching the photodetectors 20a, 20b. The aperture device 25 is attached to the etalon 18. This arrangement can specify the pair of spectra of light from the etalon 18 more definitely. The aperture device 25 may be also located as spaced from the etalon 18.

Figure 7B:
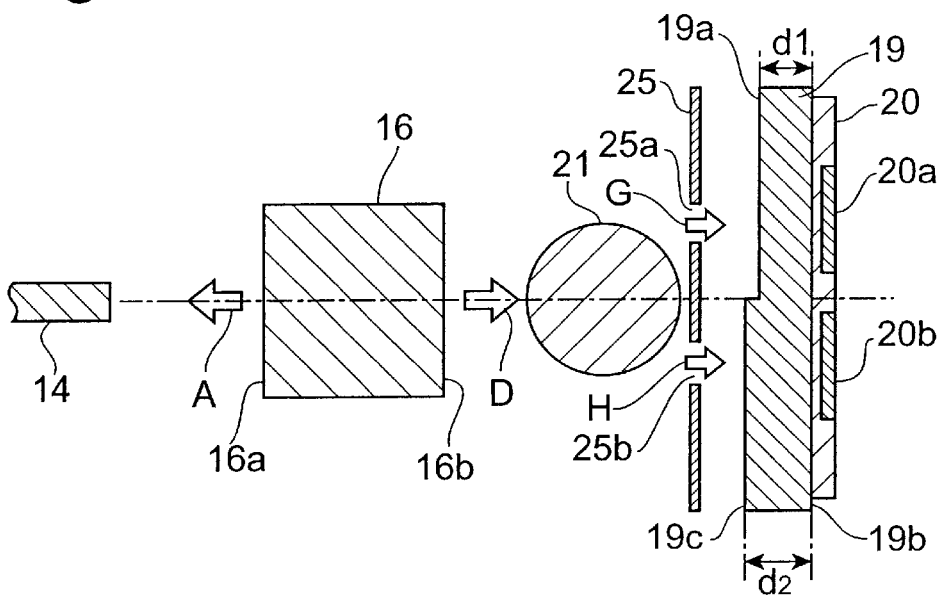

FIG. 7B shows a configuration in which the aperture device 25 is added to the etalon 19 as shown in FIG. 6B or FIG. 6C. The aperture device 25 can be located between the etalon 19 and the semiconductor laser 16 or can be located between the etalon 19 and the lens 21. In this configuration, the light incident to the etalon 19 is provided through the apertures in the aperture device 25. These light passes through the etalon 19 and thereafter reaches the photodetectors 20a, 20b. Therefore, the apertures 25a, 25b of the aperture device 25 are located at respective positions where the etalon has different thicknesses. This arrangement also permits the pair of spectra of the light from the etalon 18 to be specified more definitely. The aperture device 25 may be also located so as to be attached to the etalon 19.

In FIG. 7B, the photodiode chip 20 including the first and second photodetectors 20a, 20b is placed on the light outgoing surface 19b of the etalon 19. This arrangement decreases the number of manufacturing steps for optical positioning operations because the etalon 19 and the first and second photodetectors 20a, 20b can be aligned in advance. The photodiode chip 20 is preferably a back incidence type chip. Since the photodiode chip 20 contains the first and second photodetectors 20a, 20b on the same semiconductor substrate, the photodetectors demonstrate identical characteristics.

The aperture device 25 can also decrease unexpected, scattered light reaching the photodetectors.

Figure 9A:
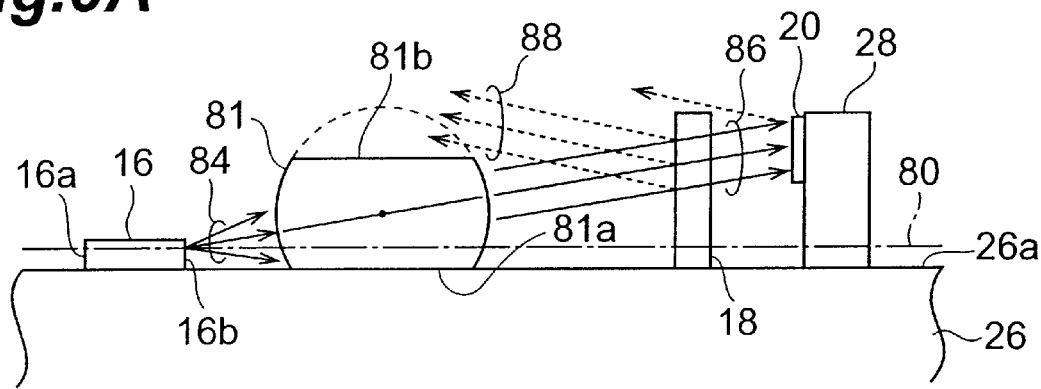
FIGS. 9A to 9C are side views showing a semiconductor laser, a lens, an etalon, and a photodetector device placed on a mount member.
Figure 9B:
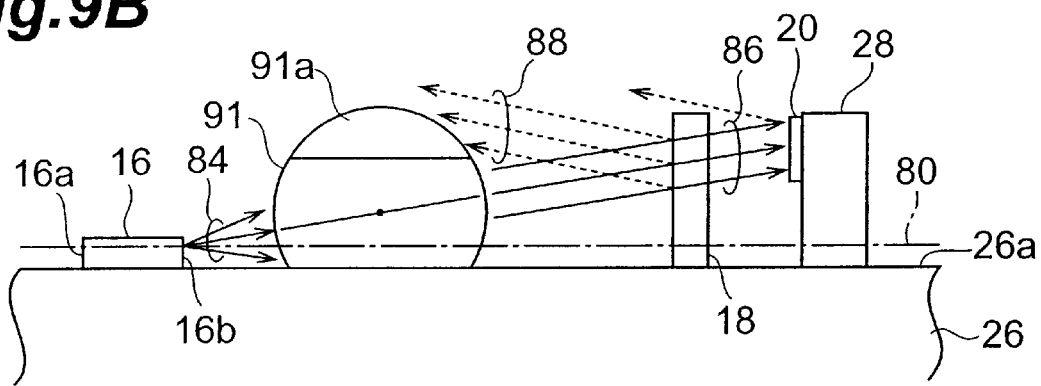
Figure 9C:
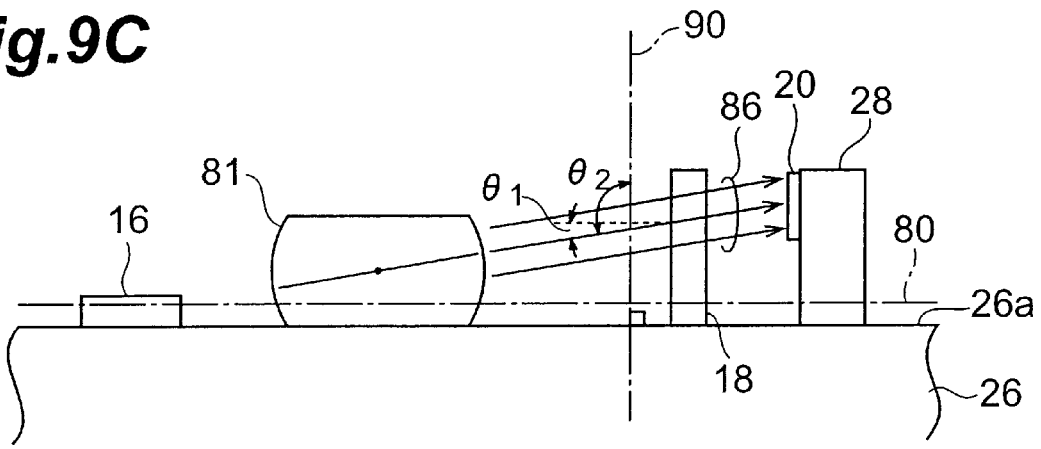
Figure 10A:
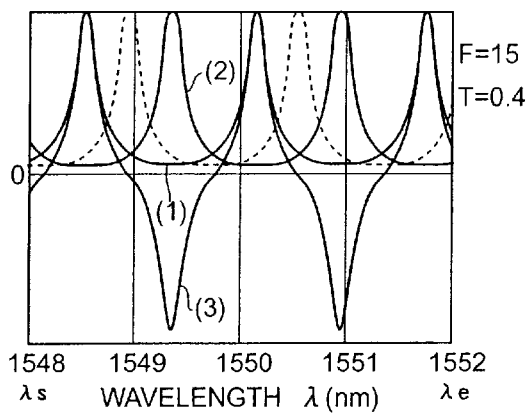
FIGS. 10A to 10F are characteristic charts of filter characteristics of etalons.
Figure 10D:
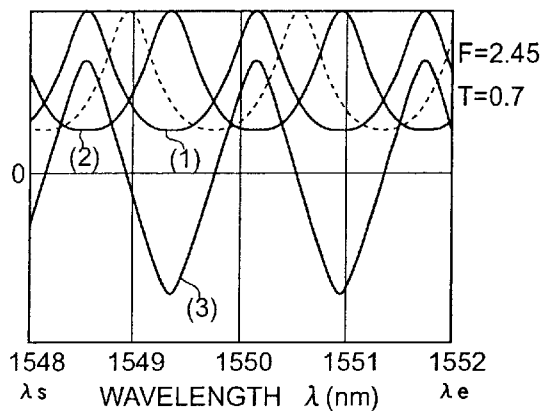
Figure 10B:
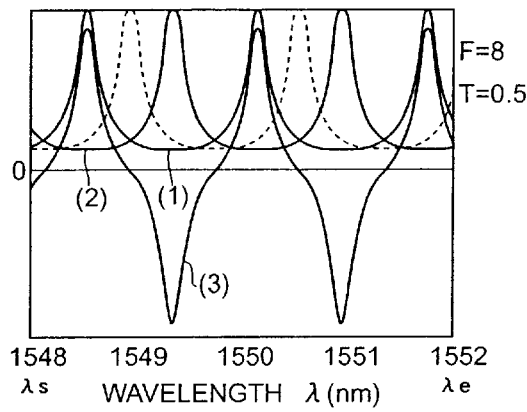
Figure 10E:
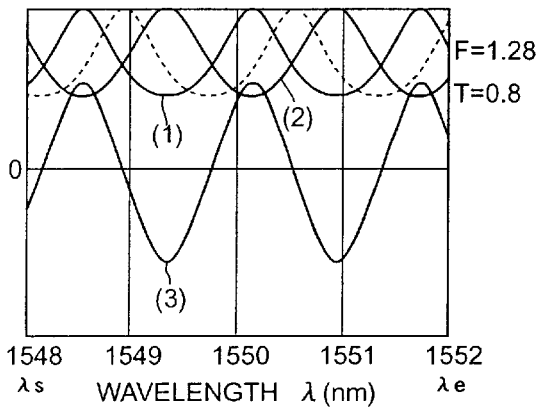
Figure 10C:
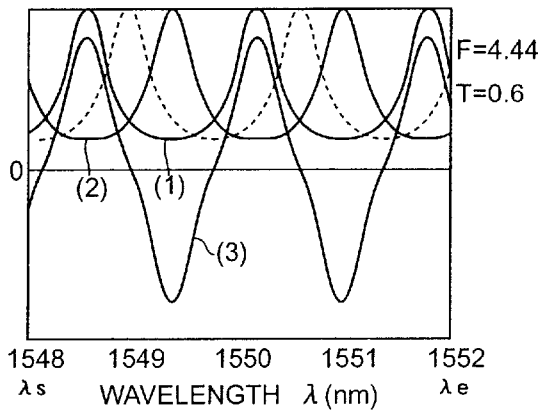
Figure 10F:
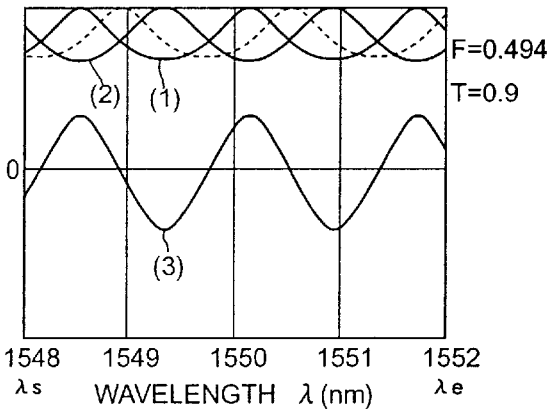

FIGS. 9A to 9C show side views of the semiconductor laser 16, lens 81, etalon 18, and photodetector 20 placed on the mount member 26. The active layer is contained in the semiconductor laser 16 and an axis 80 indicates an extending direction of the active layer. The semiconductor laser 16, lenses 81 and 91, etalon 18, and photodetector 20 are mounted so as to be optically coupled to each other on the mount surface 26a. The photodetector 20 is placed at a position higher than the height of the axis 80. This arrangement facilitates the optically coupling of the photodetector 20 with the semiconductor laser 16 through the lens.

Referring to FIG. 9A, light 84 from the semiconductor laser 16 is incident through the lens 81 to the etalon 18. Light 86 of wavelength components transmitted by the etalon 18 is received by the photodetection device 20. A part of light traveling toward the etalon 18 is reflected on the surface thereof to reverse its traveling direction, and then the reflected light 88 travels toward the semiconductor laser 16. The lens 81 has its top above the optical axis removed. This configuration can decrease reentry of the reflected light 88 into the semiconductor laser 16 due to the condensing action of the lens.

In FIG. 9A, a ball lens is used as the lens 81. The lens 81 is placed on the mount surface 26a. The lens 81 is provided with an installation surface 81a for this arrangement. The installation surface 81a is arranged so as to face the mount surface 26a, and this arrangement determines the height of the optical axis of the lens 81. The lens 81 has an upper surface 81b opposite to the installation surface 81a. The installation surface 81a and the upper surface 81b both extend in a direction of the optical axis of the lens 81. The height of the lens 81 is defined by the distance between the installation surface 81a and the upper surface 81b. Since the optical lens is provided with its upper surface, the height of the lens 81 can be decreased to a value necessary for a collimation portion enabling the lens 81 to collimate the light. This lens can reduce an amount of light that returns via the optical lens 81 to the semiconductor laser 16 after reflected by the etalon 18 and the first and second photodetectors 20 (20a, 20b) and.

As another placement configuration of the lens, In the mount member 26, the mount surface 26a may be provided with a depressed portion for receiving the mount portion of the collimating lens. When the mount portion of the lens is fitted in this depressed portion, the location of the lens is determined, and the height of the lens 81 from the mount surface 26a is also determined.

In FIG. 9B, a lens 91 is employed instead of the lens 81 as in FIG. 9A. The lens 91 has a film 91a, covering its top part, that is opaque to the reflected light 88. The film 91a is made of material with a sufficiently small transmittance of light as compared with the material of the lens. Since the lens 91 is provided with the shielding film 91a over its part above the optical axis thereof, the shielding film 91a can reduce reentry, due to the converging action of the lens, of the reflected light 88 to the semiconductor laser 16.

In this fashion, in FIGS. 9A and 9B, the lens 81 or 91 is provided with means for decreasing an amount of returning light that is reflected by at least either one of the etalon 18 and the photodetectors 20a, 20b and returns to the semiconductor light emitting device through the lens.

The inventors discovered that it was preferable for the etalon 18 to receive the incident light at an angle $\theta_2$ of which was in a range of not more than 85 degrees or not less than 95 degrees and that the angle $\theta_2$ is formed with reference with an axis 90 perpendicular to a direction in which the photodetectors 20a, 20b were arrayed (the direction normal to the top surface of FIG. 9C). For implementing this configuration, the photodetectors 20a, 20b are positioned without intersecting with a plane including the axis 80 and extending along the active layer 58 of the semiconductor laser 16 and are positioned either above or below this plane. In the embodiment of FIG. 9C, the photodetectors 20a, 20b are located above the plane. Therefore, an angle $\theta_1$ of the light incident on the etalon 18 is preferably in a range within ±5°. This can decrease an amount of light that is reflected from the etalon 18 and is directly incident on the semiconductor laser 16.

FIGS. 10A to 10F show examples of the calculation of spectral characteristics of etalons. In FIGS. 10A to 10F, the abscissa represents the wavelength ($\mu$m) and the ordinate the surface transmittance. The spectra illustrated therein were calculated with change in finesse F (or surface transmittance T), using the following values, where the thickness at the first position of the etalon 18 is d, the thickness at the second position is d+$\delta$, and the refractive index is n:

$d$=470 $\mu$m;

$\delta$=0.24 $\mu$m;

$n$=1.6.

Here, T and R denote the optical transmittance and optical reflectance of each etalon surface, respectively, from the etalon to an air layer, and it is assumed that T and R are equal to each other on the two surfaces of the etalons.

The finesse and free spectral range are defined as follows.

finesse: $F=4\times R/(1-R)^2$ free spectral range: $FSR=c/(2\cdot n\cdot d\cdot \cos(\theta))$ In each of FIGS. 10A to 10F, the transmission spectrum at the second position is indicated by line (1), the transmission spectrum at the first position by line (2), and a difference spectrum between these spectra by line (3). A dashed line indicates a transmission spectrum at an intermediate position between the first and second positions in the wedge etalon.

According to this calculation, good results are obtained when the transmittance T of the etalon is in a range of not less than 0.7 and not more than 0.9. The above range is preferable in consideration of the response property of the feedback loop to deviation from the locking wavelength. In this range, the linearity against wavelengths is superior around the zero point of the vertical axis, as indicated by the shape of the solid line (difference characteristics) (3) in FIGS. 10A to 10F. When this transmittance T is smaller than 0.7, the linearity is not always preferable as shown in the figures. When the transmittance T is larger than 0.9, the slope against wavelengths becomes small around the zero point of the vertical axis as shown in these figures. This small slope does not provide an excellent response against change of wavelength.

Figure 11:
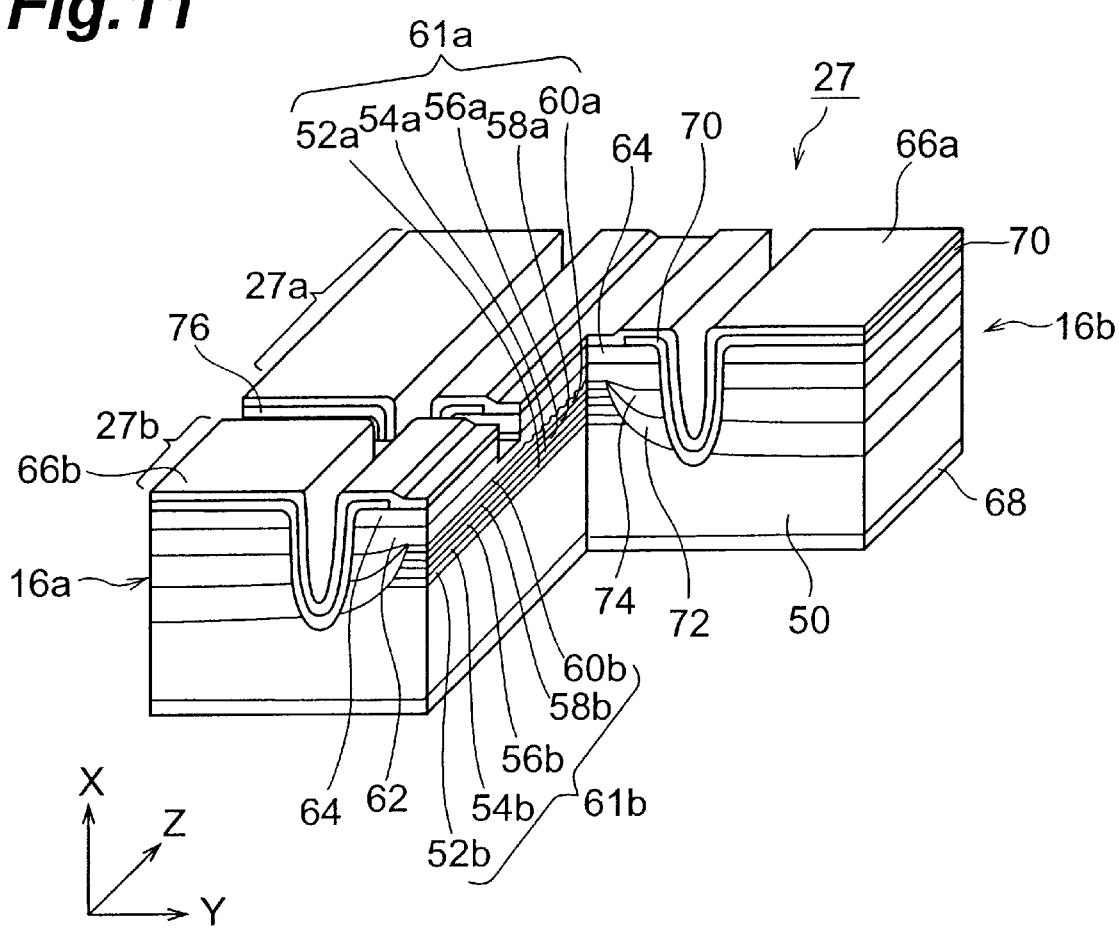
FIG. 11 is a schematic view of a semiconductor laser including a light generating portion and an optical waveguide portion.

FIG. 11 shows a semiconductor laser 27 having a light generating portion 27a and a wavelength changing portion 27b. The light generating portion 27a and the wavelength changing portion 27b are substantially electrically separated from each other by a separating portion, such as a trench provided so as to reach the second cladding layer. This wavelength changing portion 27b has an optical waveguide 58b abutting to the active layer 58a of the light generating portion 27a.

The light generating portion 27a has a buried portion 61a and the wavelength changing portion 27b has a buried portion 61b. The buried portions 61a, 61b can be made in the same semiconductor stack structure and can be made of the same semiconductor materials as in the semiconductor laser 16, but they are not limited thereto.

In order to inject carriers into the optical waveguide 58b, there is provided an electrode 66b separate from an electrode 66a for the light generating portion 27a. A signal applied between the electrodes 66b, 68 is a difference signal generated from the signals from the first and second photodetectors 20a, 20b.

When carriers are injected through the electrodes 66b, 68 into the optical waveguide 58b, the optical waveguide 58b changes its refractive index. Since the active layer 58a is optically coupled to the optical waveguide 58b, the optical distance between the two end faces of the semiconductor laser 27 is changed by the injection of carriers. This allows the control of the wavelengths of light generated by the semiconductor laser 27.

In the embodiment shown in FIG. 1 and FIG. 2, each of the photodetectors 20a, 20b is provided with a photoelectric conversion element. For example, photodiodes can be used as these photoelectric conversion elements.

The signal processor portion 22 is mounted on the mount member 30. The signal processor portion 22, for example, includes a temperature adjusting portion for driving the thermoelectric cooler 34 and a power adjusting portion for driving the semiconductor laser 16. The temperature adjusting portion receives electric signals from the photodetectors 20a, 20b, such as the photoelectric conversion elements. In response to these electric signals, the temperature adjusting portion adjusts an electric signal to the thermoelectric cooler 34 to control the oscillation wavelength of the semiconductor laser 16. The power adjusting portion receives the electric signals from the photodetection device 20. In response to the electric signals, the power adjusting portion adjusts the driving current to the semiconductor laser 16 to control the oscillation power of the semiconductor laser 16.

The signal processor portion 22 can be arranged separately from the light emitting module 1a, without being accommodated in the housing 12. In this configuration, the electric signals are transferred through the terminals 12c of the housing 12. The electric signals from the first and second photodetectors 20a, 20b are transferred through the terminals 12c to the signal processor portion 22. Electric signals from the signal processor portion 22 are transferred through the terminals 12c to the semiconductor laser 16 and/or to the thermoelectric cooler 34.

The mount member 26 and the mount member 28 are placed on the mount member 24 so as to achieve the optical coupling of the semiconductor laser 16, etalon 18, and photodetectors 20a, 20b. The mount member 30 is placed on the mount member 24 so as to receive the electric signals from the photodetectors 20a, 20b. Namely, the main functional components constituting the semiconductor laser module are mainly arranged on the mount member 24. This obviates the necessity for transmission of electrical and optical signals to and from the outside of the package 12 in order to control the oscillation wavelength and oscillation power of the semiconductor laser 16. The semiconductor laser module capable of adjusting the oscillation wavelength thereof with high accuracy can be is housed in the package.

Referring again to FIG. 1 and FIG. 2, the optical fiber 14, lenses 32a, 38a, semiconductor laser 16, etalon 18, and photodetectors 20a, 20b are arranged in a direction of a predetermined axis 46 in the semiconductor laser module 1a. This semiconductor laser module 1a utilizes the output light from the back face of the semiconductor laser 16. This output light is spectroscopically split by use of the etalon 18 to obtain a plurality of monitor light including respective wavelength components having a predetermined wavelength spacing in the wavelength spectrum of the semiconductor laser 16. The temperature of the semiconductor laser 16 is adjusted according to difference information between intensities of this monitoring light. Through this adjustment, the oscillation wavelength can be adjusted to a desired value. Further, the driving current of the semiconductor laser 16 is adjusted according to sum information of light intensities of those monitoring light. Through this adjustment, the oscillation power can be adjusted to a desired value.

Figure 12A:
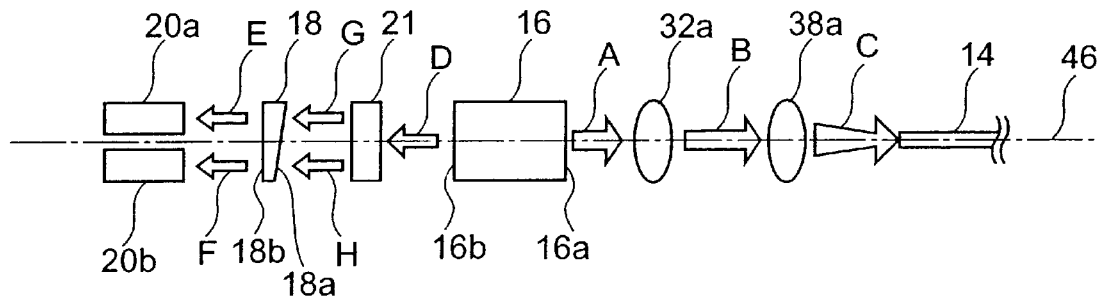
FIG. 12A is a schematic view showing propagation of light from the semiconductor laser module, FIG. 12B a characteristic chart of an oscillation spectrum of light emitted from the semiconductor laser, FIG. 12C a characteristic chart of transmission spectra of light from the etalon, and FIG. 12D a characteristic chart of transmission spectra of the etalon.
Figure 12B:
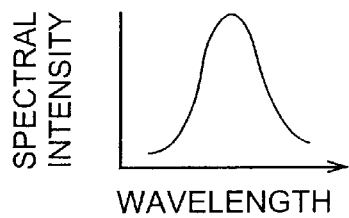
Figure 12C:
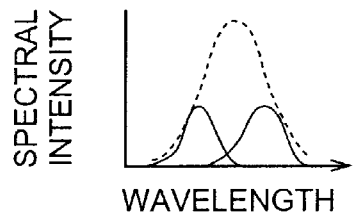

Propagation of light in the semiconductor laser module 1a will be described below with reference to FIG. 12A to FIG. 12C. FIG. 12A is a schematic view showing the propagation of light in the semiconductor laser module 1a. The optical fiber 14, lens 38a, lens 32a, semiconductor laser 16, etalon 18, optical waveguide circuit 21, and photodetectors 20a, 20b are arranged in turn in a direction of the predetermined axis 46. The light A emits from the light emitting surface 16a of the semiconductor laser 16 and then is converged through the lens 32a toward the lens 38a to form light B. Further, the light B is converged by the lens 38a so as to enter the end face of the optical fiber 14 to form light C. On the other hand, the light D emits the light reflecting surface 16b of the semiconductor laser 16 and is split into light G and light H in the light collimating means 21 such as an optical waveguide circuit and thereafter the light G and H are incident to the input surface 18a of the etalon 18. FIG. 12B shows a spectrum of light D. This spectrum reflects the oscillation characteristics of the semiconductor laser 16. The etalon 18 achieves spectroscopic separation of the incident light at the spatially different positions. Light E, F thus separated emit from the output surface of the etalon 18. Solid lines in FIG. 12C represent the spectra of the light E and F. In FIG. 12C, a dashed line represents the optical spectrum of the light D. The optical spectra reflect the optical spectral property of the etalon 18. The light E and F are introduced to the photodetectors 20a, 20b. The photodetectors 20a, 20b convert the input light E and F into electric signals, respectively.

Figure 12D:
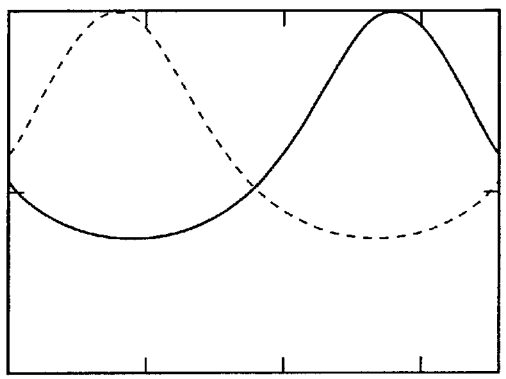
Figure 13A:
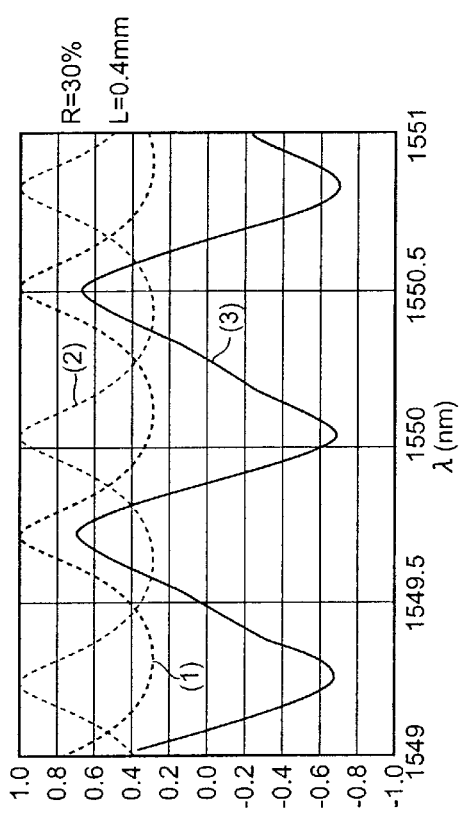
FIGS. 13A to 13D are characteristic charts showing filter characteristics of etalons having the reflectivity of 30% with variation in the spacing between photodetectors as a parameter.
Figure 13C:
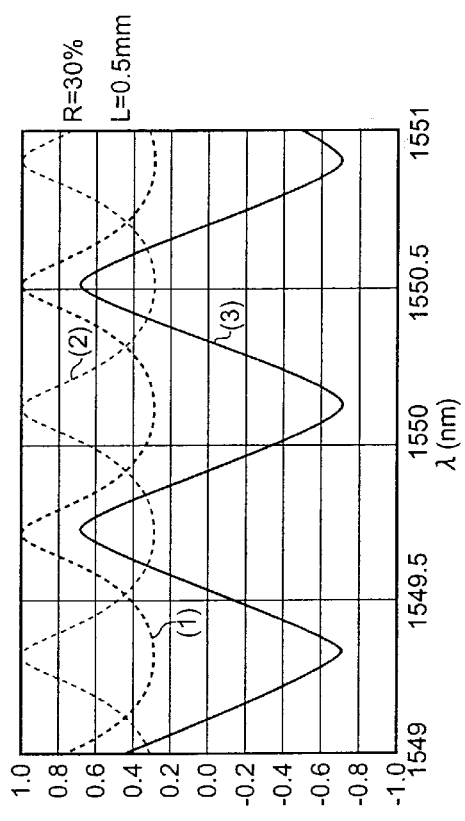
Figure 13B:
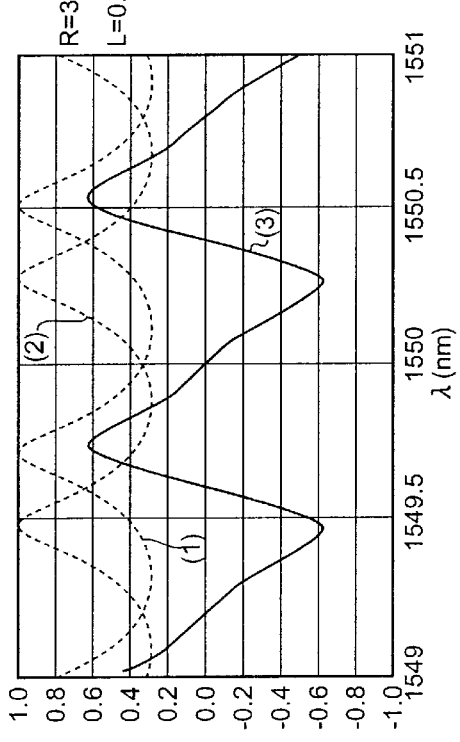
Figure 13D:
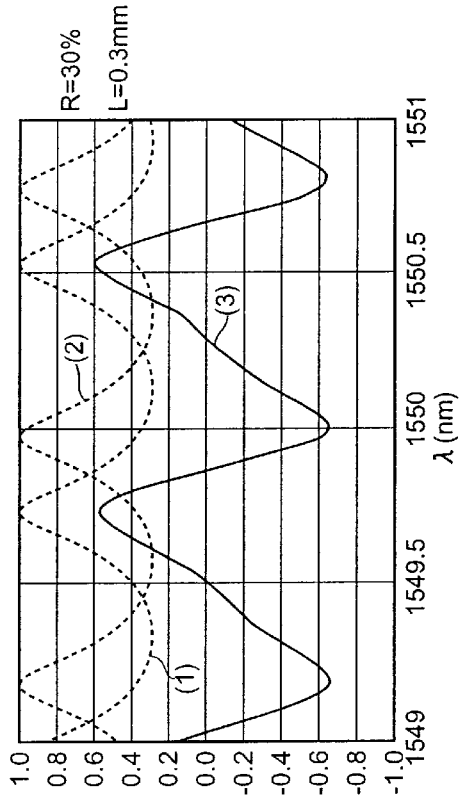
Figure 14A:
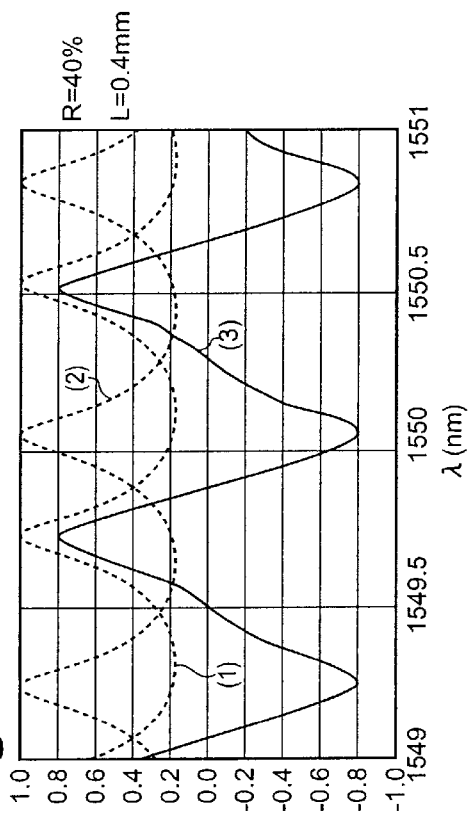
FIGS. 14A to 14D are characteristic charts showing filter characteristics of etalons having the reflectivity of 40% with variation in the spacing between photodetectors as a parameter.
Figure 14C:
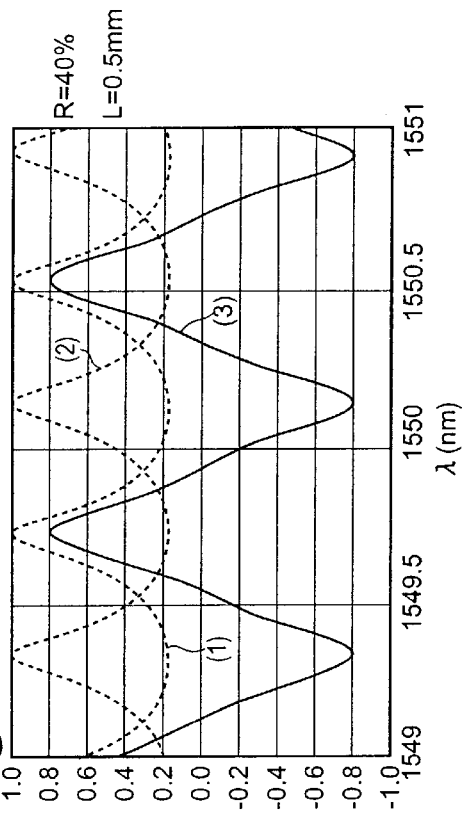
Figure 14B:
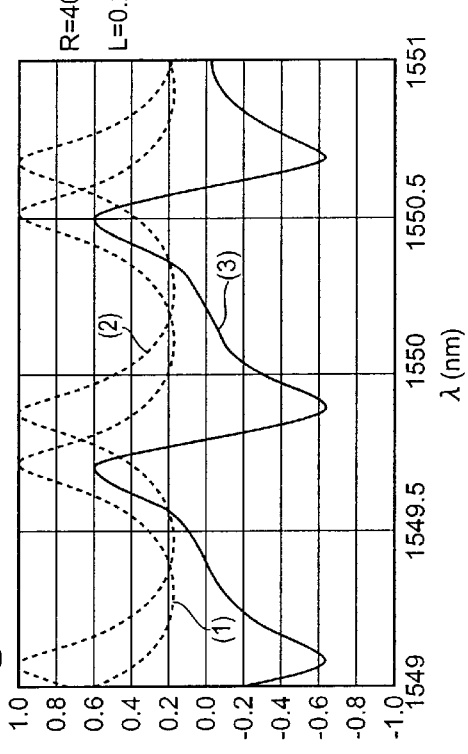
Figure 14D:
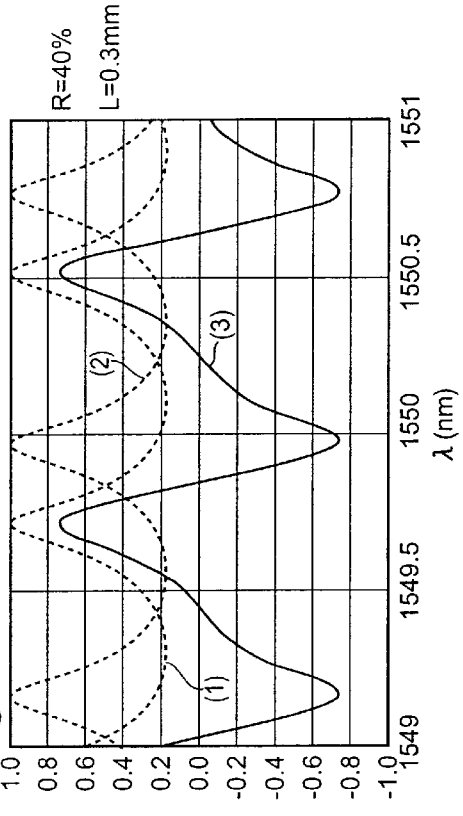
Figure 15C:
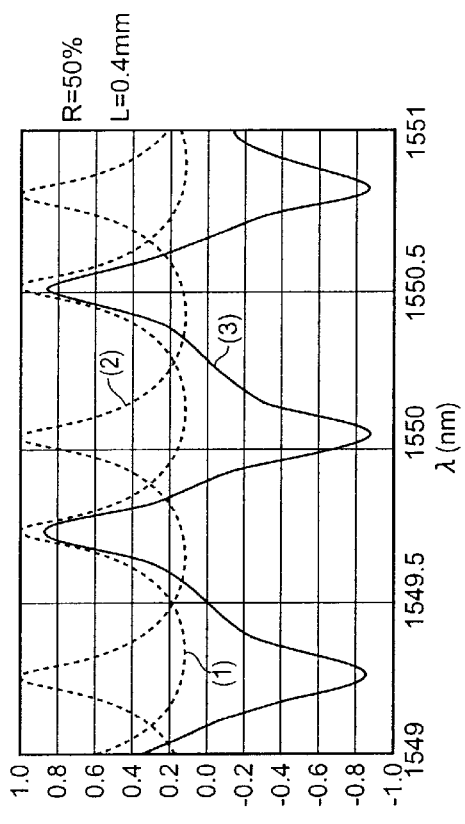
FIGS. 15A to 15D are characteristic charts showing filter characteristics of etalons having the reflectivity of 50% with variation in the spacing between photodetectors as a parameter.
Figure 15D:
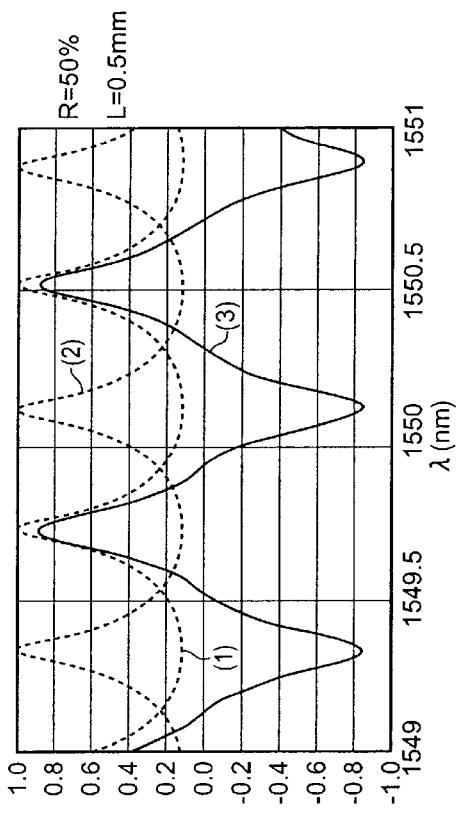
Figure 15A:
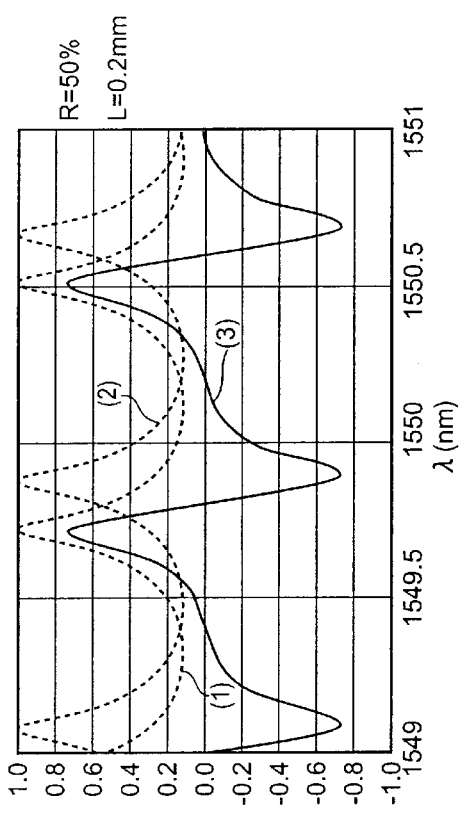
Figure 15B:
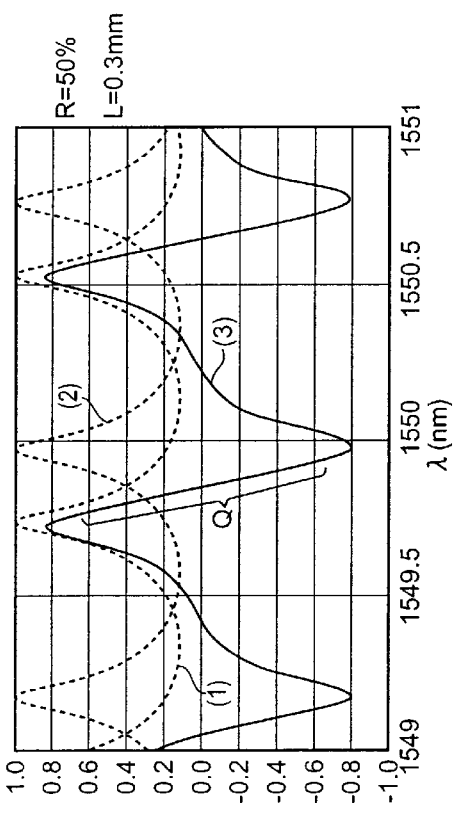
Figure 16C:
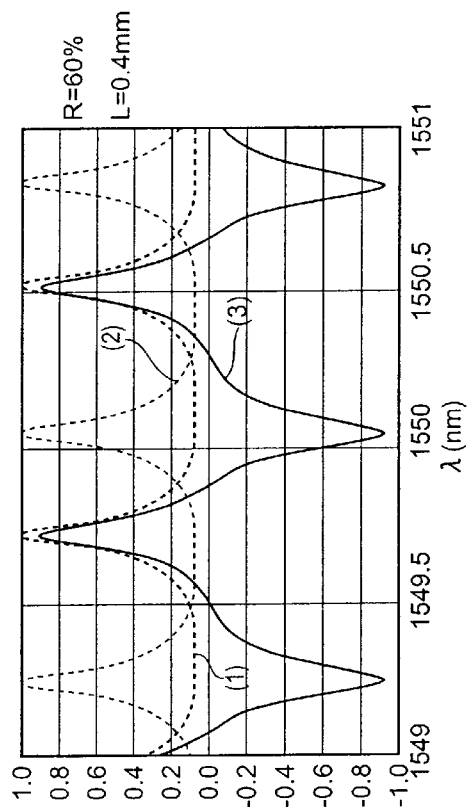
FIGS. 16A to 16D are characteristic charts showing filter characteristics of etalons having the reflectivity of 60% with variation in the spacing between photodetectors as a parameter.
Figure 16D:
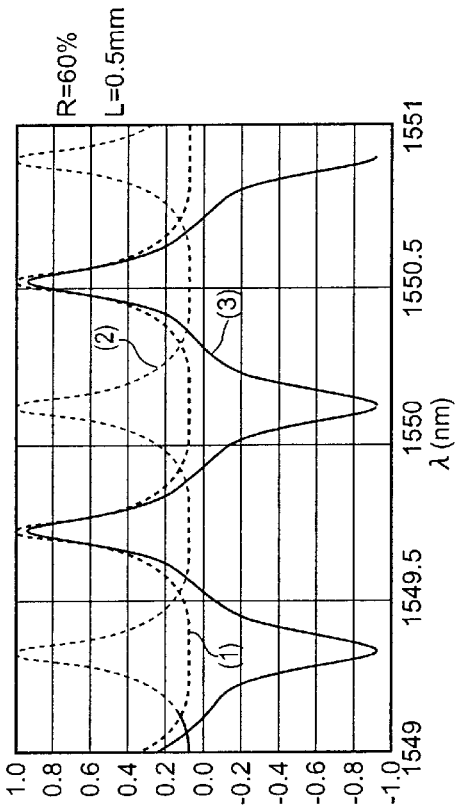
Figure 16A:
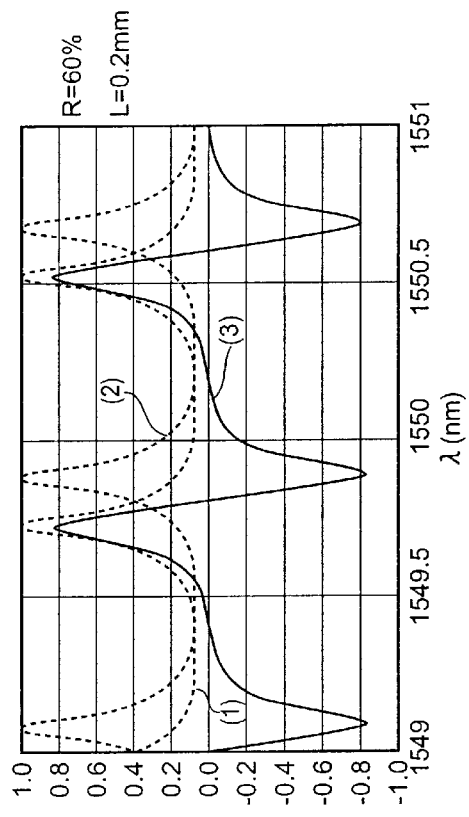
Figure 16B:
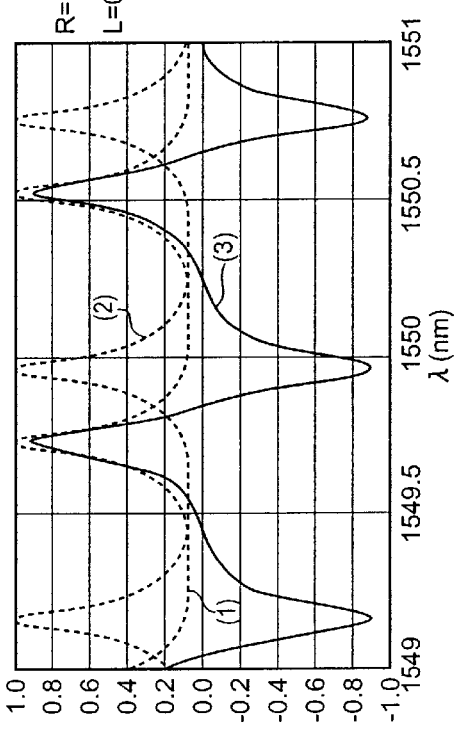

FIG. 12D is a spectral diagram to show an example of the transmission calculation for the wedge etalon. In FIG. 12D, a solid line and a dashed line represent an example of transmission spectrum calculation at two positions. This calculation was performed based on the following parameters, where the thickness at the first position of the etalon 18 is d, the thickness at the second position is d+δ, the reflectivity on the entrance surface and on the exit surface of the etalon are R, and the refractive index is n:

$d=1000 \mu m;$ $\delta=0.78 \mu m;$ $R=0.27;$ $n=1.5589.$

According to this transmission spectral diagram, the spectra at the different positions have their respective peaks at different wavelengths and overlap with each other at a wavelength indicating predetermined transmittance between those peak wavelengths. In the light emitting module employing this etalon, the wavelength can be controlled, for example, at a locking wavelength of an intersection between the solid line and the dashed line, but it is not limited thereto.

Next, described is the difference spectrum change occurring when the spacing L between the photodetectors 20a, 20b is changed in the semiconductor light module using the wedge etalon 18.

FIGS. 13A to 13D to FIGS. 16A to 16D show changes in the shape of the difference spectral line according to the change in the spacing L between the photodetectors 20a, 20b. FIGS. 13A to 13D show calculation examples in which the reflectance R is 30%, FIGS. 14A to 14D show calculation examples in which the reflectance R is 40%, FIGS. 15A to 15D show calculation examples in which the reflectance R is 50%, and FIGS. 16A to 16D show calculation examples in which the reflectance R is 60%. FIGS. 13A, 14A, 15A, and 16A show the characteristics in which the spacing L is 0.2 mm; FIG. 13B, 14B, 15B, and 16B show the characteristics in which the spacing L is 0.3 mm; FIG. 13C, 14C, 15C, and 16C show the characteristics in which the spacing L is 0.4 mm; FIG. 13D, 14D, 15D, and 16D show the characteristics in which the spacing is 0.5 mm.

In each of these figures, the transmission spectrum at the first position is indicated by line (1), the transmission spectrum at the second position is indicated by line (2), and the difference spectrum between these spectra is indicated by line (3). In the wedge etalon 18 used for these calculations, the relative inclination angle α between the light receiving surface 18a and the light outgoing surface 18b was 0.029135° and the refractive index n was 1.5589.

It is apparent from the calculations shown in FIGS. 13A to 13D to FIGS. 16A to 16D that the shape of the difference spectral line (3) varies in various manner, depending upon combinations of the reflectance R with the spacing L. The characteristics with a reflectance R of 50% shown in FIGS. 15A to 15D will be described below as an example. As the spacing L decreases from 0.5 mm (FIG. 15D), the transmission spectral line (2) shifts relative to the transmission spectral line (1). With the relative shift, the symmetry degrades in the difference spectral line (3) derived from these two transmission spectra. It is, however, noted here that the linearity of this difference spectrum is extremely good in a curve portion Q shown in FIG. 15B. If the locking wavelength is set in this portion with good linearity, the response property of the feedback loop can be improved against deviation from the locking wavelength. This improvement is achieved optically.

The inventors conducted studies on the response property of the feedback loop. From the studies, the inventors found a preferred range for the slope of the difference spectrum. The range is as follows: an absolute value of a change rate in a wavelength width of 0.1 nm containing the locking wavelength, for example, the wavelength at a zero of the difference spectrum, was not less than 20%. Namely, it is preferable that the absolute value of the slope at a zero of the difference spectrum be not less than 200 (%/nm).

Figure 17:
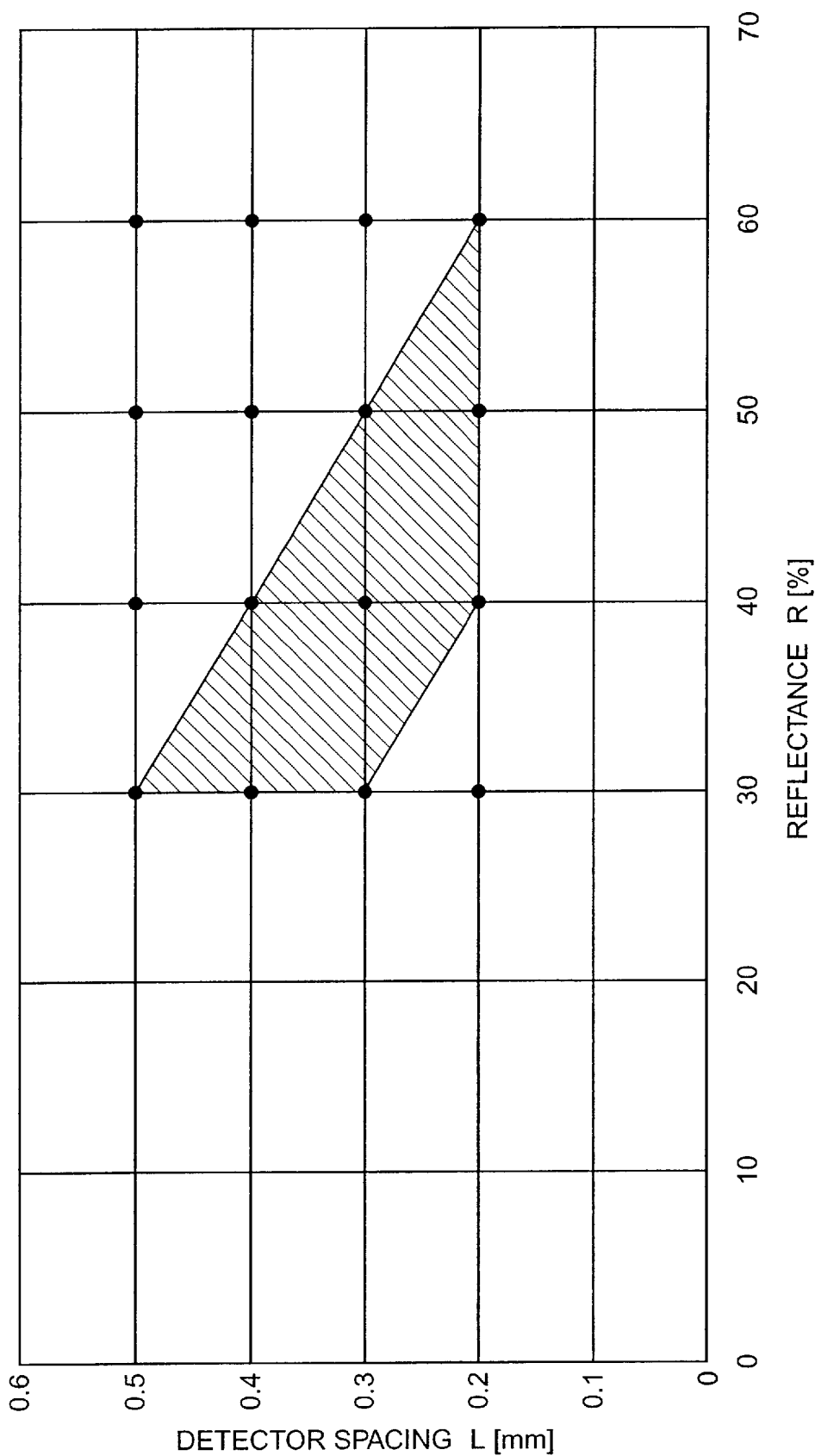
FIG. 17 is a graph showing favorable combinations between reflectivity of the etalon 18 and the spacing between photodetectors.

Based on the examples of calculations described above, the inventors studied conditions for the reflectance R and the photodetector spacing L in order to obtain a difference spectrum with excellent linearity. From the studies, the inventors think that the hatching area in FIG. 17 represents preferred conditions of the reflectance R and the photodetector spacing L. Namely, the region specified by the following formulas is preferable for L (mm) and R (%)

$$R \geq 30 \quad \text{Eq (1)}$$

$$R \leq 60 \quad \text{Eq (2)}$$

$$L \geq -0.01 \times R + 0.6 \quad \text{Eq (3)}$$

$$L \leq -0.01 \times R + 0.8 \quad \text{Eq (4)}$$

$$L \leq 0.2 \quad \text{Eq (5)}$$

The reflectance R of not less than 30% (Eq (1)) is preferable because the effect of interference in the wedge etalon 18 becomes weak at too low reflectances. The reflectance of not more than 60% (Eq (2)) is preferable because too high reflectances increase the number of multiple reflections inside the etalon and thus result in failing to outstand the intrinsic performance of the etalon.

The inventors noted the slope and linearity near zeros of the difference spectral line (3). The inventors conducted studies with various changes in the spacing between the photodetectors 20a, 20b and concluded that preferred relations of the reflectance R with the spacing L between the photodetectors 20a, 20b were Eqs (3) and (4), in addition to aforementioned Eqs (1) and (2).

If the spacing L between the photodetectors 20a, 20b becomes too small, the difference between the wavelengths of the transmitted light at the first and second positions (the difference between the transmission spectra) will become small. This will raise a possibility of failing to obtain the difference spectrum with sufficient intensity. The inventors conducted further studies with consideration to this point and concluded that the spacing L was preferably not less than 0.2 mm (Eq (5)).

The inventors also determined the wavelength sensitivity in the hatched area in FIG. 17. As a result, the good wavelength sensitivity of not less than 15 dB/nm is obtained in that area.

The following describes how to accomplish the reflectance R of the wedge etalon 18 and the spacing L between the photodetectors 20a, 20b so as to satisfy the aforementioned, preferred conditions. The first step is to determine the angle α of inclination of the wedge etalon 18 and the reflectance (30% to 60%) of the light receiving surface 18a and the light outgoing surface 18b. After that, the spacing L between the photodetectors is calculated. Then the photodetection device 20 is fabricated so as to locate the photodetectors 20a, 20b at the spacing thus calculated.

Figure 18A:
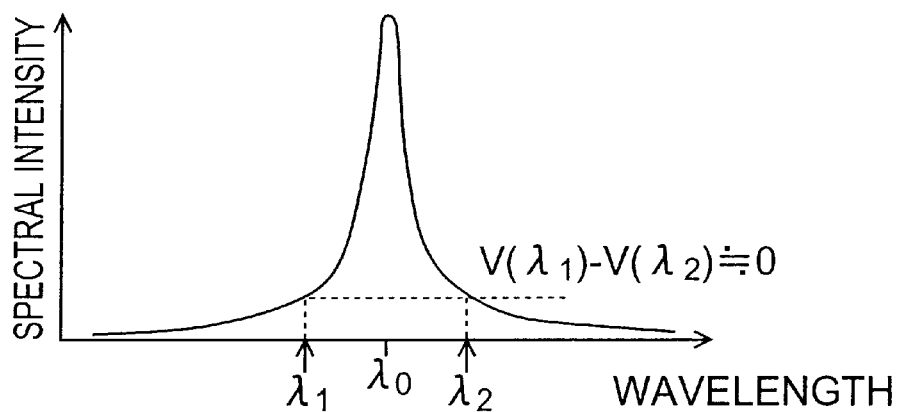
FIGS. 18A to 18C are schematic diagrams showing oscillation spectra of a semiconductor laser.
Figure 18B:
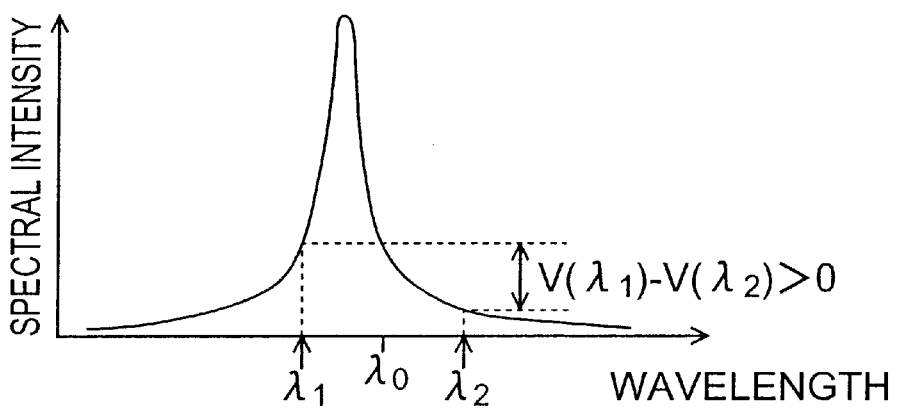
Figure 18C:
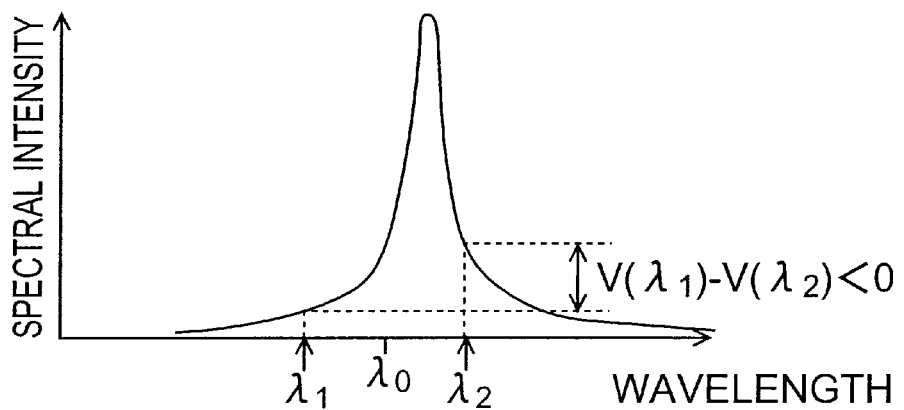

Next described is an algorithm of adjusting the oscillation spectrum according to the information about light intensities at the two wavelengths in the oscillation spectrum of the semiconductor laser 16 obtained in this fashion. FIGS. 18A to 18C are schematic diagrams showing the oscillation spectra of the semiconductor laser. The abscissa represents the wavelength of light and the ordinate represents the spectral intensity (power). The center wavelength of the laser light is denoted by $\lambda_0$. On both sides of this center wavelength $\lambda_0$, at least two wavelengths (wavelength regions) $\lambda_1, \lambda_2$ are selected in the oscillation spectrum. In the etalon 18 shown in FIG. 3, the light of the wavelengths $\lambda_1$, $\lambda_2$ are selected.

FIG. 18A shows a spectrum obtained when the semiconductor laser 16 oscillates at the center wavelength $\lambda_0$. At this situation, the intensities of signals resulting from photoelectric conversion of the light of the wavelengths $\lambda_1$, $\lambda_2$ optically separated by the etalon 18 are equal to each other. Therefore, the difference signal V(R1)−V(R2) becomes a predetermined value, i.e., zero in this case.

FIG. 18B shows a spectrum obtained when the semiconductor laser 16 oscillates at a wavelength shorter than the center wavelength $\lambda_0$. At this situation, the difference signal V(R1)−V(R2) becomes larger than the predetermined value. This difference signal indicates that the oscillation wavelength of the semiconductor laser 16 needs to be shifted to the longer wavelength region. According to this signal, the temperature of the semiconductor laser 16 is changed by the Peltier element 34. In this situation, since the temperature of the semiconductor laser 16 needs to be increased, the polarity and magnitude of the current to the Peltier element 34 are controlled.

FIG. 18C shows a spectrum obtained when the semiconductor laser 16 oscillates at a wavelength longer than the wavelength $\lambda_0$. At this situation, the difference signal V(R1)−V(R2) becomes smaller than the predetermined value. This difference signal indicates that the oscillation wavelength of the semiconductor laser 16 needs to be shifted to the shorter wavelength region. According to this signal, the temperature of the semiconductor laser 16 is changed by the Peltier element 34. In this situation, since the temperature of the semiconductor laser 16 needs to be decreased, the polarity and magnitude of the current to the Peltier element 34 are controlled.

In this fashion, the oscillation spectrum can be adjusted by carrying out the negative feedback control based on the difference information between light intensities at two monitoring wavelengths in the oscillation spectrum. The above example shows the algorithm for two wavelengths on the both sides of the center wavelength $\lambda_0$, but the control algorithm is not limited to this example. When the two monitor wavelengths are selected on the shorter wavelength region than the center wavelength $\lambda_0$, the oscillation spectrum can be also adjusted similarly by controlling the difference signal V(R1)−V(R2) to a predetermined value. A coefficient of temperature change of the oscillation wavelength of the semiconductor laser 16 is, for example, approximately 0.1 nm/° C.

Automatic control of the oscillation power of the semiconductor laser 16 (APC control) can be performed based on the sum signal of signals at a plurality of monitoring wavelengths. In this case, the driving current of the semiconductor laser 16 is controlled so as to keep the value of the sum signal constant.

The above example has illustrated the configuration of two photoelectric conversion elements 12 for monitoring the oscillation spectrum, but three or more photoelectric conversion elements may be employed. In this case, if electric signals from these photoelectric conversion elements are controlled by a microcomputer (CPU), information about the shape of the oscillation spectrum can also be obtained. At this case, the oscillation power of the semiconductor laser 16 can also be estimated based on the sum of the signals from the three or more photoelectric conversion elements.

Since the etalon (etalon 18 or etalon 19) is mounted on the same mount member 26 as the semiconductor laser 16 is, the temperature of the etalon also varies with change in the temperature of the Peltier element 34.

When the wavelength locking in the semiconductor light emitting device is effected at different wavelengths as in the WDM systems, the following problem will arise. The problem results from the difference between temperature dependence of the oscillation wavelength of the semiconductor laser 16 and temperature dependence of etalon properties. The thickness and refractive index of the etalon vary with change in the temperature of the etalon. These variations due to temperature change cause variation in optical characteristics (etalon properties), such as the wavelengths of the light transmitted by the etalon and the FSR thereof.

When the locking wavelength is changed from a preset wavelength to another wavelength apart by the WDM wavelength spacing, the temperature of the semiconductor laser 16 is changed so as to shift the oscillation wavelength of the semiconductor laser 16 by the WDM wavelength spacing. If the WDM wavelength spacing is approximately equal to the FSR of the etalon, the feedback characteristics at the locking point after this change will become almost identical. Thus, the characteristics become excellent at each WDM wavelength. However, the WDM wavelength spacing is not always equal to the FSR of the etalon because of the following factors: the etalon properties also have temperature dependence; and the temperature of the etalon also varies at the same time as the change of the temperature of the semiconductor laser 16.

Figure 19A:
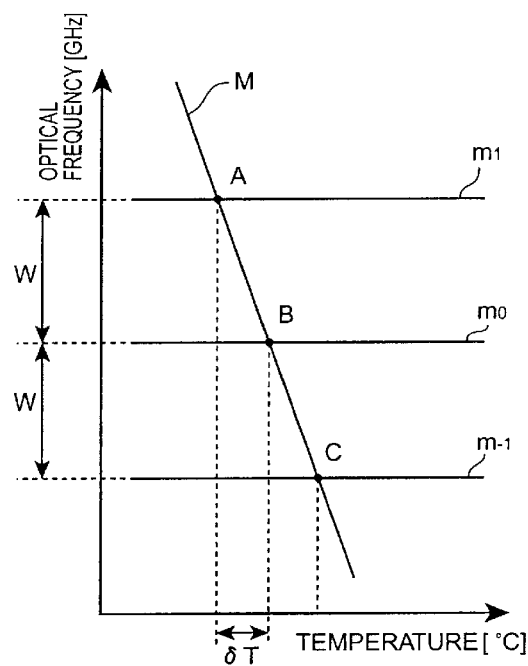
FIGS. 19A to 19C are schematic diagrams showing examples of temperature dependence of optical frequency of semiconductor laser light and temperature dependence of frequency of light transmitted by the wedge etalon 18.
Figure 19C:
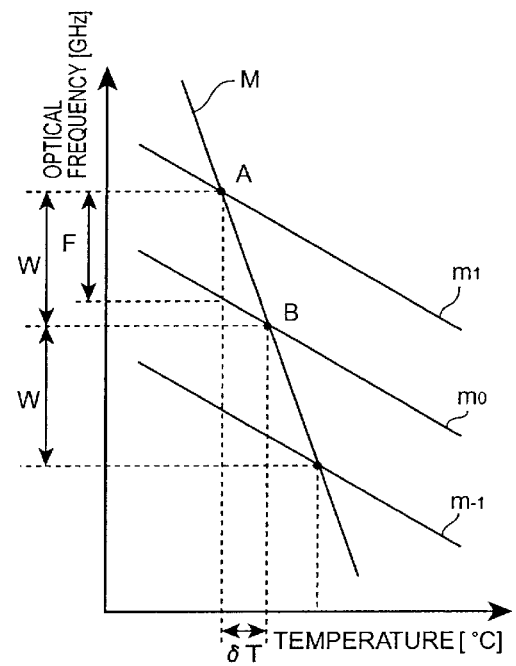
Figure 19B:
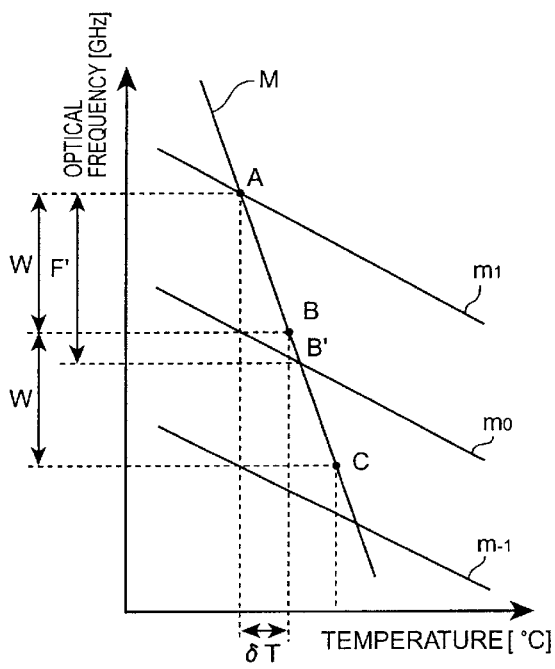

The inventors found the following ideas for solving this problem. The ideas will be described with reference to FIGS. 19A to 19C. FIGS. 19A to 19C are schematic diagrams illustratively showing temperature dependence of frequency of the semiconductor laser light and temperature dependence of light transmitted through the wedge etalon 18. The frequency of laser light varies with change in the temperature of the semiconductor laser. In these figures, a straight line M represents change of frequency against temperature. Light interfering in interference orders m−1, m, m+1 varies with change in the temperature of the etalon 18. Straight lines $m_{-1}$, $m_0$, $m_1$ represent temperature changes of the interference light of the respective orders.

The FSR of the wedge etalon has a value of frequency of 100 GHz ($\delta v_{WDM}$: WDM frequency) converted from the WDM wavelength spacing. Assuming that the etalon is made of quartz, a thickness d at a middle point between the first position of thickness d1 and the second position of thickness d2 is calculated as follows.

$$d = c/(2 \cdot n \cdot v_{WDM})$$
$$= 1.04 \text{ mm}$$

In this equation, c is the speed of light and n the refractive index of quartz (1.44).

Let us assume that in the light emitting module using the wedge etalon, the wavelength locking is effected, for example, at a point A in FIGS. 19A to 19C. For shifting the lock point to a point B apart by the WDM frequency spacing W (100 GHz), a temperature change $\delta T$ corresponding to this shift is calculated as follows.

$$\delta T = 100 \text{ GHz}/(-13 \text{ GHz}/° \text{ C.})$$
$$= 7.7° \text{ C.}$$

Here −13 GHz/° C. was employed as the temperature dependence of the oscillation wavelength of the semiconductor laser 16. According to the result of this calculation, the locking point can be shifted to the point B by changing the temperature of the semiconductor laser 16 by 7.7° C. ($\delta T$). If the frequencies of the interference light of the etalon 18 should have no temperature dependence, the straight line $m_0$ representing the frequency of interference light of the etalon 18 would intersect at the point B with the straight line M, as shown in FIG. 19A. The straight line M indicates the temperature dependence of oscillation frequency of the semiconductor laser 16. Therefore, the feedback characteristics almost equivalent to those before the shifting can be realized even with the shift of the locking wavelength.

However, since the actual frequencies of the interference light of the etalon 18 have the temperature dependence, the straight lines $m_{-1}$, $m_0$, $m_1$ have a slope as shown in FIG. 19B. For this slope, the straight line M and the straight line $m_0$ do not intersect at the point B but intersect at a point B' with each other. Specifically, since the temperature dependence of the frequencies of the interference light of the etalon is −1.5 GHz/° C., the FSR spacing of the etalon 18 is given as follows:

$$FSR = 100 \text{ GHz} + (-1.5 \text{ GHz}/° \text{ C.}) \times 7.7° \text{ C.}$$
$$= 112 \text{ GHz,}$$

which is a value F' different from the WDM frequency spacing (100 GHz). This FSR spacing F' of 112 GHz is shown in FIG. 19B.

The inventors discovered that the introduction of a correction factor k is convenient for obtaining a desired etalon. The inventors calculated the thickness d at the middle point between the first position of thickness d1 and the second position of thickness d2 of the quartz etalon as described below.

$$d = c/(2 \cdot n \cdot k \cdot \delta v_{WDM}) \quad \text{Eq (6)}$$

In this equation, k (0<k<1) is preferably given as follows.

$$k = 1 - (dv/dT)_{etalon}/(dv/dT)_{LD}$$

According to estimation by the inventors, the gradients are estimated as follows.

$$(dv/dT)_{etalon} = -1.5 \text{ GHz}/^\circ \text{ C.}$$

$$(dv/dT)_{LD} = -13 \text{ GHz}/^\circ \text{ C.}$$

This presents the following.

$$k = 1 - (-1.5/-13) = 0.88$$

Therefore, the thickness d of the quartz wedge etalon is given as follows.

$$d = 1.04/0.88 = 1.18 \text{ mm}$$

The FSR value is 88.3 GHz. This FSR value corresponds to the spacing F of FIG. 19C.

For shifting the locking point from the point A to the point B in FIG. 19C, the temperature of the semiconductor laser 16 should be changed by 7.7° C. At the same time as this change, the temperature of the etalon 18 also changes by 7.7° C. Since the temperature dependence of the frequencies of the interference light is −1.5 GHz/° C. in the etalon 18, the FSR spacing is calculated as follows.

$$FSR = 88.3 \text{ GHz} + (-1.5 \text{ GHz}/^\circ \text{ C.}) \times 7.7^\circ \text{ C.}$$
$$= 100 \text{ GHz}$$

Since this change is almost equal to the WDM frequency spacing (W in FIG. 19C), the straight line M and straight line $m_0$ intersect at the point B with each other, as shown in FIG. 19C. Accordingly, excellent feedback characteristics can be implemented by locking the wavelength at this point B.

In the above illustrative description, the thickness d at the middle point between the first position of thickness d1 and the second position of thickness d2 was calculated in the wedge etalon 18 based on Eq (6) above. It is a matter of course that the thickness d1 at the first position may be determined based on Eq (6). In the case of the etalon 19 being used, the thickness d determined by above Eq (6) may be selected to be equal to an average of the thickness d1 and the thickness d2 or the thickness d1 at the first position may be selected to be equal to the thickness d determined by above Eq (6).

Figure 20:
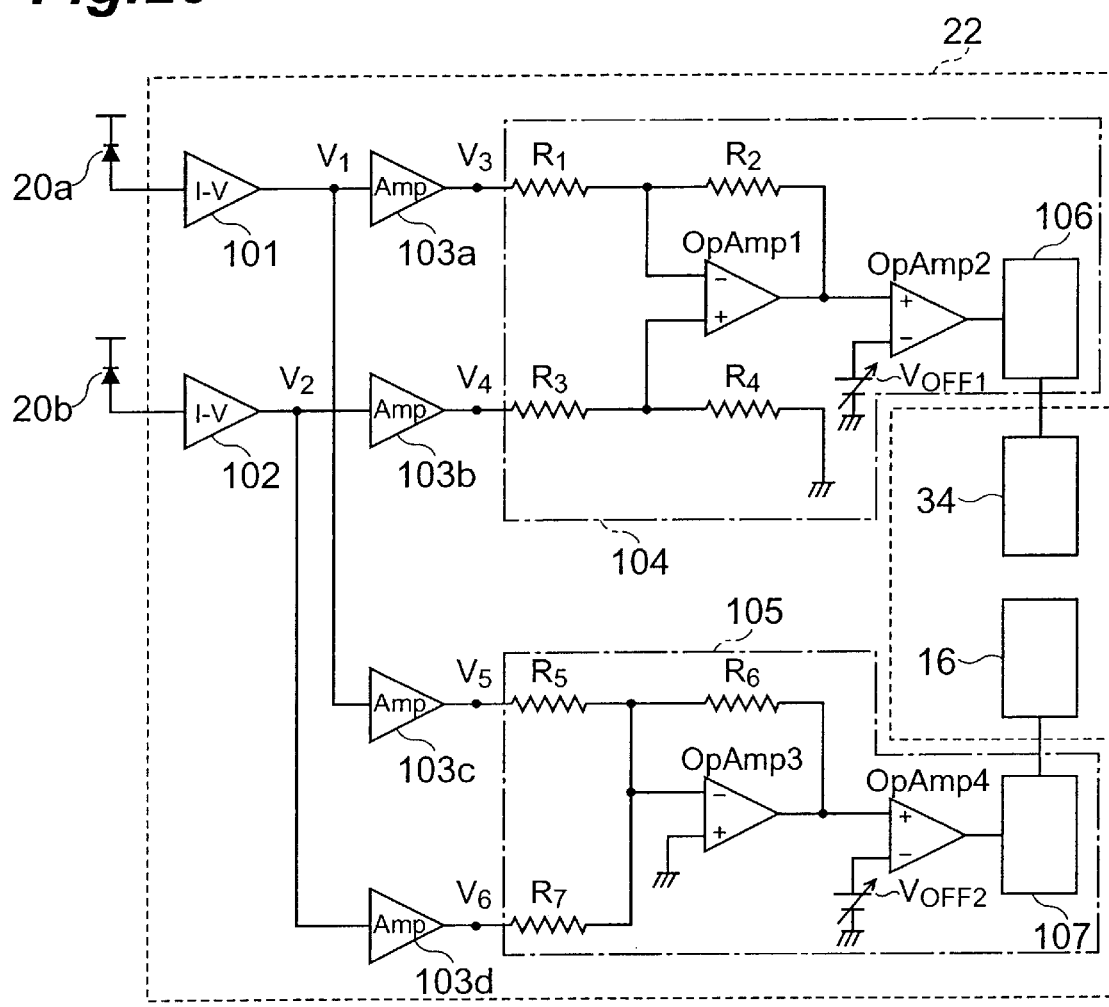
FIG. 20 is a circuit diagram illustratively showing a circuit capable of realizing an algorithm for wavelength adjustment.

FIG. 20 is a circuit diagram of an exemplary circuit that can realize the control algorithm described heretofore. The electric current signals from the photoelectric conversion elements 20a, 20b are converted into voltage signals V1, V2, respectively, by current-voltage converters 101, 102. The voltage signals V1, V2 are amplified by preamplifiers 103a, 103b, 103c, 103d to generate voltage signals V3, V4, V5, V6, respectively. The voltage signals V3, V4 are provided to a difference signal generating circuit 104 and then are converted into a current signal for driving the Peltier element 34. The voltage signals V5, V6 are provided to a sum signal generating circuit 105 and then are converted into a current signal for driving the semiconductor laser 16.

The difference signal generating circuit 104 receives the input voltage signal V3 at one end of resistor R1. The other end of the resistor R1 is connected to a negative input of an operational amplifier (OpAmp1) and to one end of resistor R2. The other end of the resistor R2 is connected to an output of the operational amplifier (OpAmp1). The difference signal generating circuit 104 receives the input voltage signal V4 at one end of resistor R3. The other end of the resistor R3 is connected to a positive input of the operational amplifier (OpAmp1) and to one end of resistor R4. The other end of the resistor R4 is connected to a reference potential (ground). When resistances of R1, R2, R3, and R4 are equal to each other, a voltage indicating a difference between the input signals V3, V4 appears at the output of the operational amplifier (OpAmp1). This difference signal is provided to a Peltier element driving circuit 106 to drive the Peltier element 34. The output of the operational amplifier (OpAmp1) can be applied to a positive input of an operational amplifier (OpAmp2), and the output of the operational amplifier (OpAmp2) to the input of the Peltier element driving circuit 106. If a power supply $V_{OFF1}$ for offset adjustment is connected to a negative input of the operational amplifier (OpAmp2) in order to enable the application of an offset to the locking wavelength, the Peltier element 34 can be driven under a preferred condition.

The sum signal generating circuit 105 receives the input voltage signal V5 at one end of resistor R5. The other end of the resistor R5 is connected to a negative input of an operational amplifier (OpAmp3) and to one end of resistor R6. The other end of the resistor R6 is connected to the output of the operational amplifier (OpAmp3). The sum signal generating circuit 105 receives the input voltage signal V6 at one end of resistor R7. The other end of the resistor R7 is connected to the negative input of the operational amplifier (OpAmp3) and to one end of each resistor R5, R6. The positive input of the operational amplifier (OpAmp3) is connected to the reference potential (ground). When resistances of R5, R6, and R7 are equal to each other, a voltage indicating the sum of the input signals V5, V6 appears at the output of the operational amplifier (OpAmp3). This sum signal is provided to a driving circuit 107 of the semiconductor laser 16 to drive the semiconductor laser 16. The output of the operational amplifier (OpAmp3) can be applied to a positive input of an operational amplifier (OpAmp4), and the output of the operational amplifier (OpAmp4) to the input of the driving circuit 107 of the semiconductor laser 16. If a voltage supply $V_{OFF2}$ for offset adjustment is connected to the negative input of the operational amplifier (OpAmp4), the semiconductor laser 16 can be driven appropriately.

In FIG. 2, the signal processing portion 22 is realized in the compact structure using an integrated circuit and passive elements, such as resistors, capacitors. Therefore, these components can be accommodated in the same housing or placed outside the housing.

Figure 21:
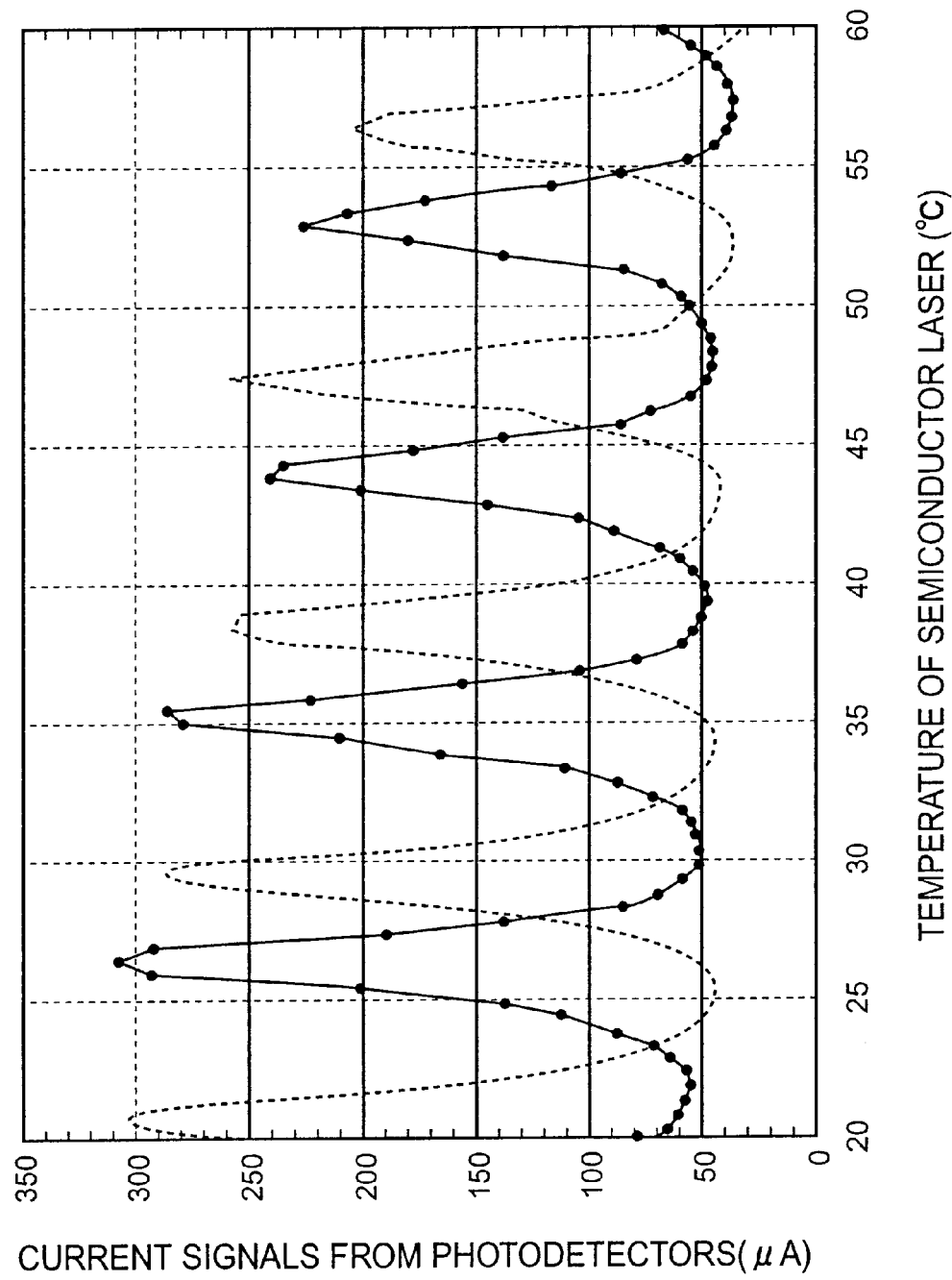
FIG. 21 is a characteristic chart of measured values showing the variation of electric signals from the photodetectors against the temperature of the semiconductor laser changed by a Peltier element.
Figure 22:
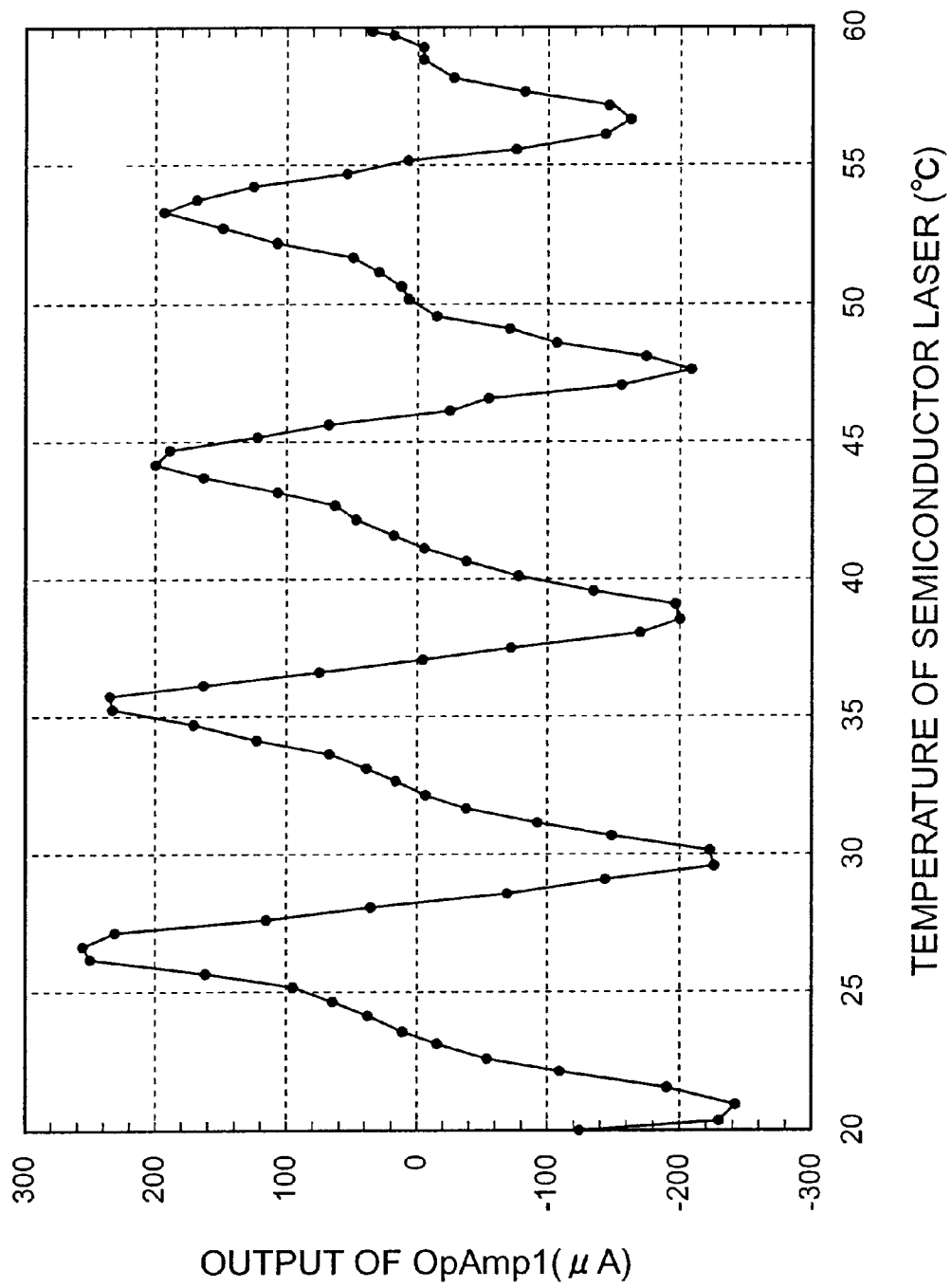
FIG. 22 is a characteristic diagram of measured values showing variation of output of OpAmp1 in the circuit shown in FIG. 19 against the temperature of the semiconductor laser changed by the Peltier element.

FIG. 21 is a characteristic chart to show actual measurements for the change of current signals from the photodetectors 20a, 20b against the temperature of the semiconductor laser intentionally changed by the Peltier element. A solid line represents the signal from the photodetector 20a and a dashed line represents the signal from the photodetector 20b. FIG. 22 is a characteristic chart to show an example of actual measurements for the difference signal, i.e., the output of OpAmp1 in the circuit shown in FIG. 20, that changes with temperature change in the semiconductor laser. These measured values are illustrative of the actually measured values of the output signals from the photodetectors 20a, 20b and the difference signal between these signals.

As described above, the light emitting module of the present embodiment permits the adjustment of the wavelength of light generated without using such apparatus as the optical spectrum analyzer.

The principles of the present invention have been illustrated and described heretofore with the preferred embodiments, and it should be understood by those skilled in the art that the present invention involves various modifications in arrangement and in details without departing from the principles as described. For example, the wedge etalon 18 and the etalon 19 were exemplified, but the etalon can be either of etalons in other configurations that have different thicknesses at different positions. It is also possible to utilize an etalon device as a combination of a plurality of etalons each having predetermined light interference property. Accordingly, the inventors claim rights over all modifications and changes falling within the scope of the appended claims and within the scope of the spirit of the invention.

What is claimed is:

1. A light emitting module comprising:

a semiconductor light emitting device having first and second end faces;

a photodetection device having first and second photodetectors each optically coupled to said first end face of said semiconductor light emitting device;

an etalon device having a first portion of a first thickness and a second portion of a second thickness, said first portion being located between said first end face of said semiconductor light emitting device and said first photodetector, and said second portion being located between said first end face of said semiconductor light emitting device and said second photodetector; and collimating means for providing substantially collimated light to said etalon device receiving light from said semiconductor light emitting device, wherein the first thickness of said etalon device is different from the second thickness of said etalon device.

2. The light emitting module according to claim 1, wherein said etalon device has a first surface and a second surface so that a spacing between the first surface and the second surface achieves said first thickness in said first portion, said first surface being arranged so as to be opposed to said second surface, and wherein said etalon device has a third surface and a fourth surface so that a spacing between the third surface and the fourth surface achieves said second thickness in said second portion, and said third surface is arranged so as to be opposed to said fourth surface.

3. The light emitting module according to claim 2, wherein said etalon device has a light receiving surface for receiving light from said first end face of said semiconductor light emitting device and a light outgoing surface opposed to said light receiving surface, wherein in said etalon device, said light receiving surface includes said first and third surfaces and said light outgoing surface includes said second and fourth surfaces, and wherein said light receiving surface is inclined relative to said light outgoing surface so that a spacing between said light receiving surface and said light outgoing surface increases in a direction directed from said first portion to said second portion of said etalon device.

4. The light emitting module according to claim 1, wherein said etalon device is inclined relative to a light emitting direction of said semiconductor light emitting device with respect to a direction perpendicular to a direction directed from said first portion to said second portion of said etalon device.

5. The light emitting module according to claim 1, wherein each of said first and second photodetectors is a photodiode device and said first and second photodetectors are attached to said etalon device.

6. The light emitting module according to claim 1, further comprising an aperture device having a plurality of apertures located between each of said first and second photodetectors and said semiconductor light emitting device.

7. The light emitting module according to claim 1, wherein said collimating means comprises an optical lens.

8. The light emitting module according to claim 7, further comprising means for reducing an amount of light returning from at least either of said first and second photodetectors and said etalon device through said optical lens to said semiconductor light emitting device.

9. The light emitting module according to claim 7, wherein said lens has a size determined so as to reduce an amount of light returning from at least either of said first and second photodetectors and said etalon device to said semiconductor light emitting device.

10. The light emitting module according to claim 7, wherein said lens has a height determined so as to reduce an amount of light returning from at least either of said first and second photodetectors and said etalon device to said semiconductor light emitting device.

11. The light emitting module according to claim 7, wherein said lens has a shield portion arranged so as to reduce an amount of light returning from at least either of said first and second photodetectors and said etalon device to said semiconductor light emitting device.

12. The light emitting module according to claim 1, wherein said etalon device is arranged so as to receive incident light at an angle formed relative to an axis perpendicular to an array direction of said first and second photodetectors, and said angle is in a range of not more than 85 degrees or not less than 95 degrees.

13. The light emitting module according to claim 1, further comprising light wavelength adjusting means for changing a wavelength of light according to signals from said first and second photodetectors, said light being generated by said semiconductor light emitting device.

14. The light emitting module according to claim 1, wherein a surface transmittance of said etalon device is not less than 0.7 nor more than 0.9.

15. The light emitting module according to claim 3, wherein reflectances of said light receiving surface and light outgoing surface of said etalon device are each in a range of not less than 30% nor more than 60%.

16. The light emitting module according to claim 15, wherein a spacing L (mm) between said first photodetector and said second photodetector satisfies the following relations:

$$-0.1R+0.6 \leq L \leq -0.01R+0.8,$$

where R (%) is a surface reflectance of said etalon device, and $$0.2 \leq L.$$

17. The light emitting module according to claim 3, wherein a spacing between said first photodetector and said second photodetector is determined so that an absolute value of a slope at a zero point of a difference spectrum obtained from a difference between a first transmission spectrum and a second transmission spectrum is not less than 200 (%/nm), wherein said first transmission spectrum is specified in the first portion of said etalon device, and wherein said second transmission spectrum is specified in the second portion of said etalon device.

18. The light emitting module according to claim 3, wherein each of said first and second photodetectors has a first width thereof in a first direction and a second width thereof in a second direction, and is formed so that said first width is smaller than said second width, wherein said light receiving surface of said etalon device is inclined relative to said light outgoing surface in said first direction, and wherein said second direction is perpendicular to said fist direction.

19. The light emitting module according to claim 3, wherein a predetermined thickness d of said etalon device is determined by the following:

$$d = c/(2 \cdot n \cdot k \cdot \delta v_{WDM}),$$

where $$k = 1 - (dv/dT)_{etalon}/(dv/dT)_{LD},$$

- $(dv/dT)_{etalon}$: change rate of peak interference frequency of transmitted light against temperature, the light interfering at a position of the thickness d of said etalon device,
- $(dv/dT)_{LD}$: change rate of frequency of emitting light against temperature, the light being generated in said semiconductor light emitting device,
- $\delta v_{WDM}$: wavelength division multiplexing (WDM) frequency spacing.

20. The light emitting module according to claim 1, wherein said semiconductor light emitting device includes a semiconductor laser device.

* * * * *